United States Patent
Uchida

(10) Patent No.: US 10,555,087 B2
(45) Date of Patent: Feb. 4, 2020

(54) ACOUSTIC SENSOR AND CAPACITIVE TRANSDUCER

(71) Applicant: OMRON Corporation, Kyoto (JP)

(72) Inventor: Yuki Uchida, Shiga (JP)

(73) Assignee: Omron Corporation, Kyoto (JP)

( * ) Notice: Subject to any disclaimer, the term of this patent is extended or adjusted under 35 U.S.C. 154(b) by 25 days.

(21) Appl. No.: 15/808,712

(22) Filed: Nov. 9, 2017

(65) Prior Publication Data

US 2018/0167740 A1 Jun. 14, 2018

(30) Foreign Application Priority Data

Dec. 12, 2016 (JP) .................................. 2016-240655

(51) Int. Cl.
*H04R 9/08* (2006.01)
*B81B 3/00* (2006.01)

(52) U.S. Cl.
CPC ............. *H04R 9/08* (2013.01); *B81B 3/0072* (2013.01); *B81B 3/0021* (2013.01); *B81B 2201/0257* (2013.01); *H04R 2201/003* (2013.01)

(58) Field of Classification Search
CPC ... B81B 3/0024; B81B 3/0027; B81B 3/0035; B81B 3/0037; B81B 3/0072; B81B 3/0021; B81B 3/0018; H04R 9/08; H04R 19/005; H04R 19/01; H04R 19/016; H04R 19/04; H04R 1/04; H04R 31/00; H02N 1/00
See application file for complete search history.

(56) References Cited

U.S. PATENT DOCUMENTS

| | | | |
|---|---|---|---|
| 2002/0067663 A1* | 6/2002 | Loeppert | B81B 3/0072 367/181 |
| 2007/0201710 A1* | 8/2007 | Suzuki | B81B 3/0072 381/174 |

(Continued)

FOREIGN PATENT DOCUMENTS

| | | |
|---|---|---|
| CN | 102325294 A | 1/2012 |
| CN | 104469640 A | 3/2015 |

(Continued)

OTHER PUBLICATIONS

Widder et al., Basic Principles of MEMS Microphones, May 14, 2014, www.edn.com/design/analog/4430264/Basic-principles-of-MEMS-microphones, pp. 1-9 (Year: 2014).*

(Continued)

*Primary Examiner* — Fan S Tsang
*Assistant Examiner* — Angelica M McKinney
(74) *Attorney, Agent, or Firm* — Osha Liang LLP

(57) ABSTRACT

An acoustic sensor has a semiconductor substrate having an opening, a back plate that is disposed facing the opening of the semiconductor substrate, that is configured to function as a fixed electrode, and that has sound holes that allow passage of air, a vibration electrode film disposed facing the back plate through a void, and a casing configured to house the substrate, the back plate, and the vibration electrode film, and having a pressure hole that allows inflow of air. The acoustic sensor converts transformation of the vibration electrode film into a change in capacitance between the vibration electrode film and the back plate to detect sound pressure.

18 Claims, 16 Drawing Sheets

(56) References Cited

U.S. PATENT DOCUMENTS

| | | | |
|---|---|---|---|
| 2008/0019543 A1* | 1/2008 | Suzuki | H04R 19/005 381/174 |
| 2008/0031476 A1 | 2/2008 | Wang et al. | |
| 2009/0309171 A1* | 12/2009 | Schrank | B81B 3/0072 257/415 |
| 2011/0278684 A1 | 11/2011 | Kasai | |
| 2013/0069179 A1 | 3/2013 | Ishimoto et al. | |
| 2014/0084394 A1* | 3/2014 | Je | B81B 7/0054 257/416 |
| 2014/0126762 A1 | 5/2014 | Zoellin et al. | |
| 2014/0319629 A1 | 10/2014 | Schelling et al. | |
| 2015/0014796 A1 | 1/2015 | Dehe | |
| 2015/0078593 A1 | 3/2015 | Uchida | |
| 2015/0256924 A1 | 9/2015 | Hoekstra et al. | |
| 2015/0264462 A1 | 9/2015 | Okugawa | |
| 2016/0037263 A1* | 2/2016 | Pal | H04R 19/04 381/113 |

FOREIGN PATENT DOCUMENTS

| | | |
|---|---|---|
| CN | 104918195 A | 9/2015 |
| EP | 2386840 A2 | 11/2011 |
| JP | 2011-250170 A | 12/2011 |
| WO | 2016029378 A1 | 3/2016 |

OTHER PUBLICATIONS

STMicroelectronics, Tutorial for MEMS microphones, Feb. 2017, www.st.com/content/ccc/resource/technical/document/application_note/46/0b/3e/74/cf/fb/4b/13/DM00103199.pdf/files/DM00103199.pdf/jcr:content/translations/en.DM00103199.pdf, pp. 1-20 (Year: 2017).*

Search Report issued in European Application No. 17198739.9, dated May 8, 2018 (7 pages).

Office Action issued in Chinese Application No. 201710998297.9; dated Nov. 4, 2019 (40 pages).

* cited by examiner

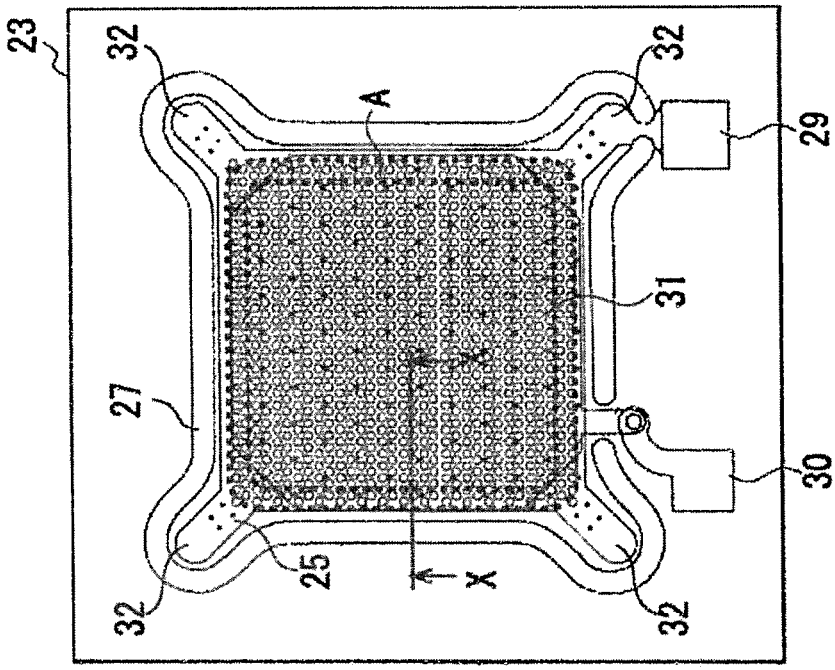
FIG. 5A
FIG. 5B
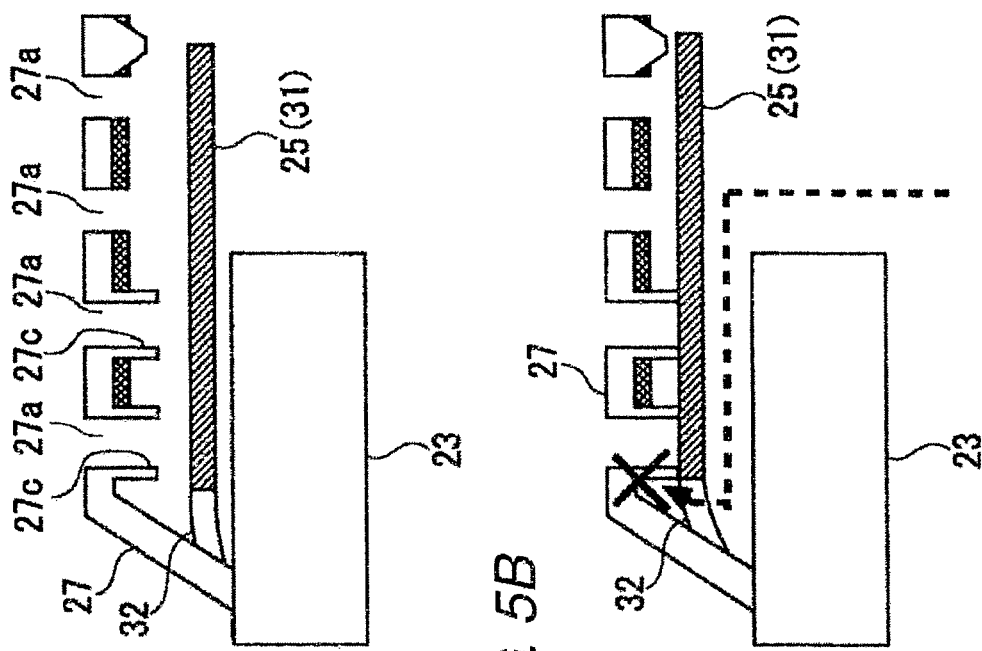
FIG. 5C

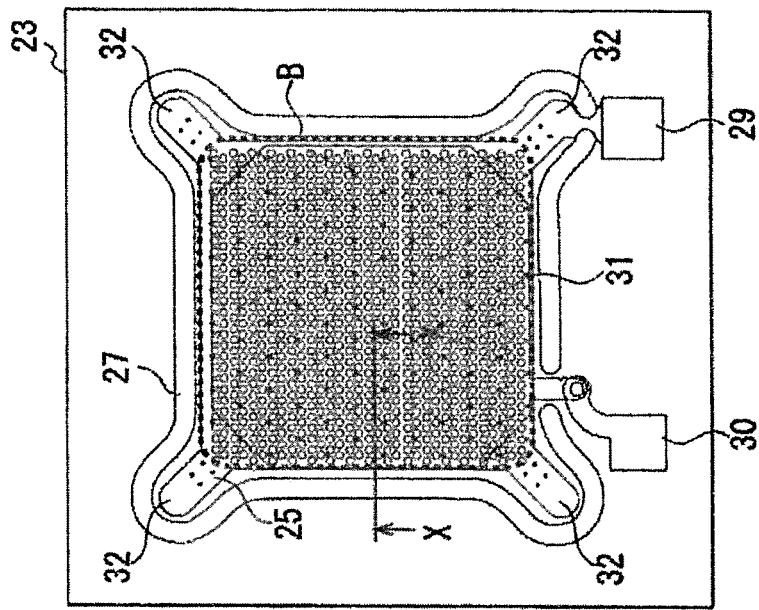
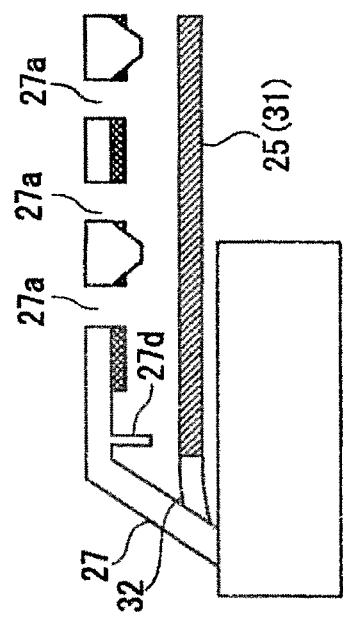
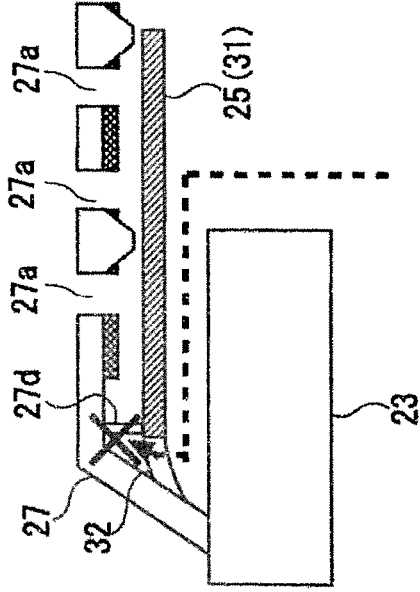
FIG. 7A
FIG. 7B
FIG. 7C

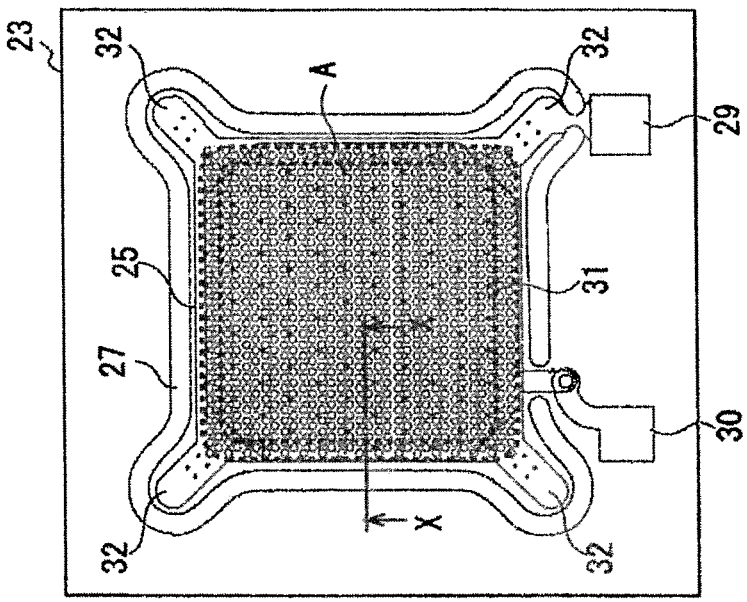
FIG. 9C
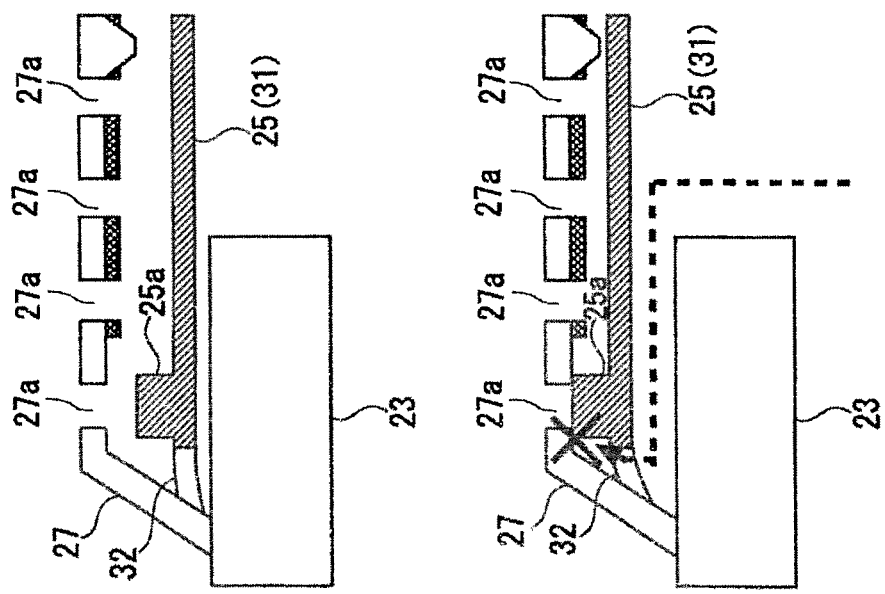
FIG. 9A
FIG. 9B

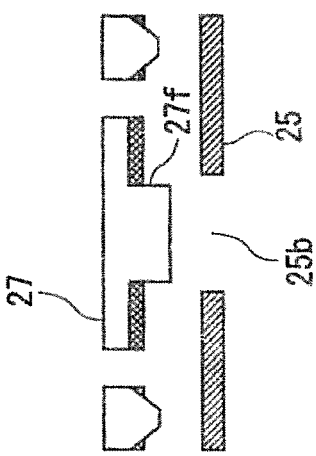
FIG. 10A
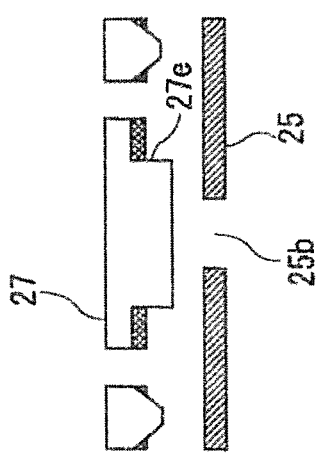
FIG. 10B
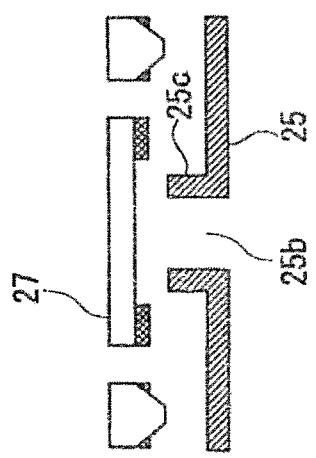
FIG. 10C
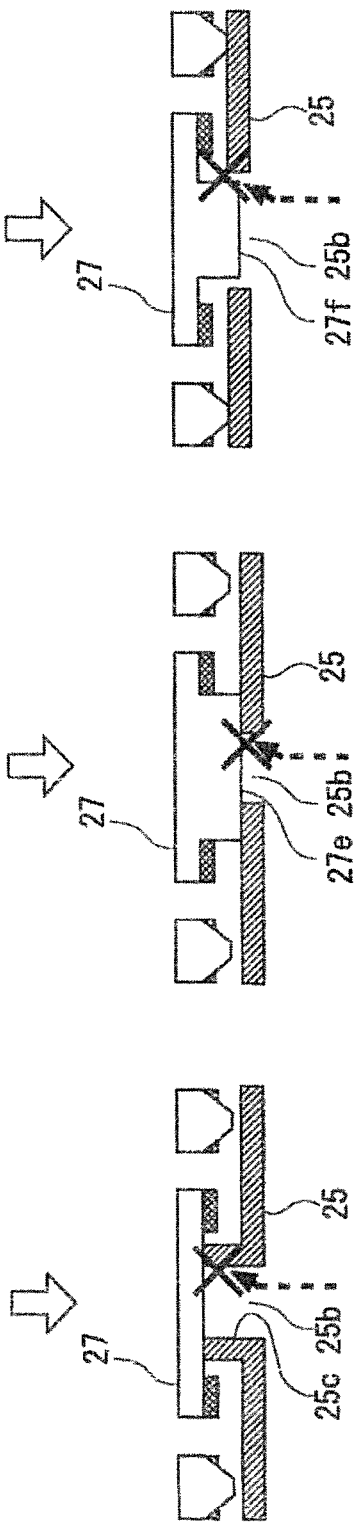

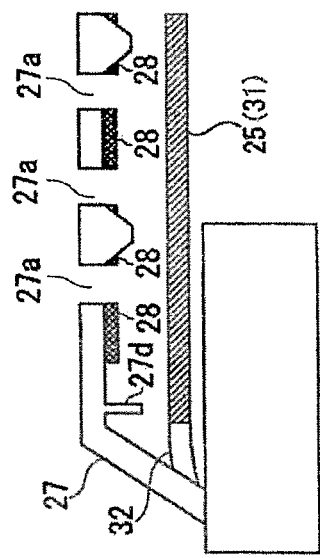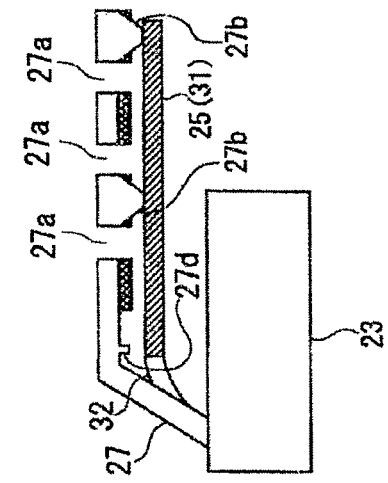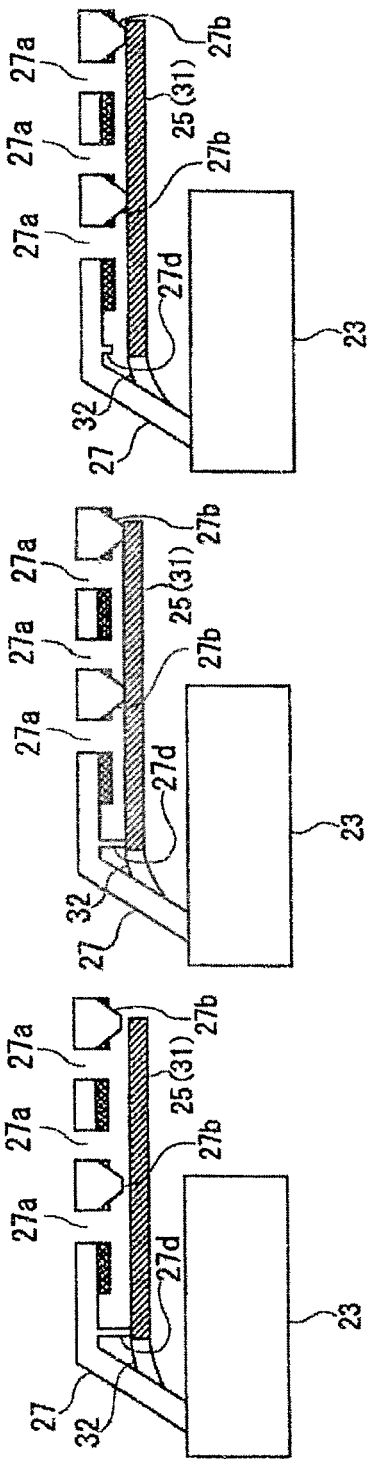

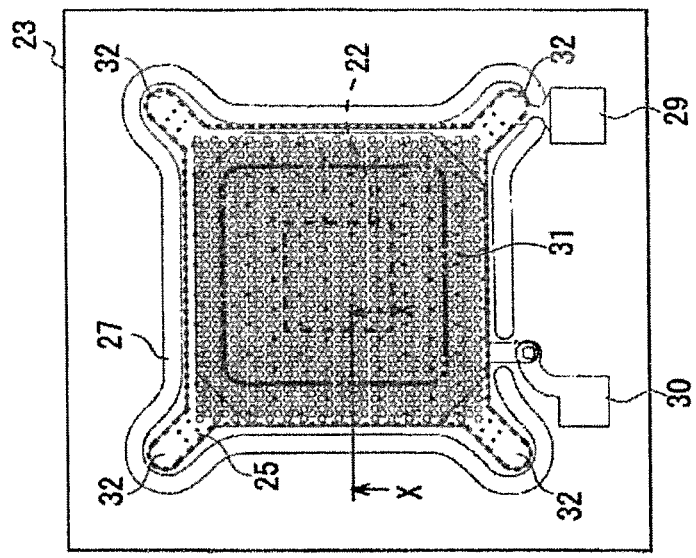
FIG. 13C
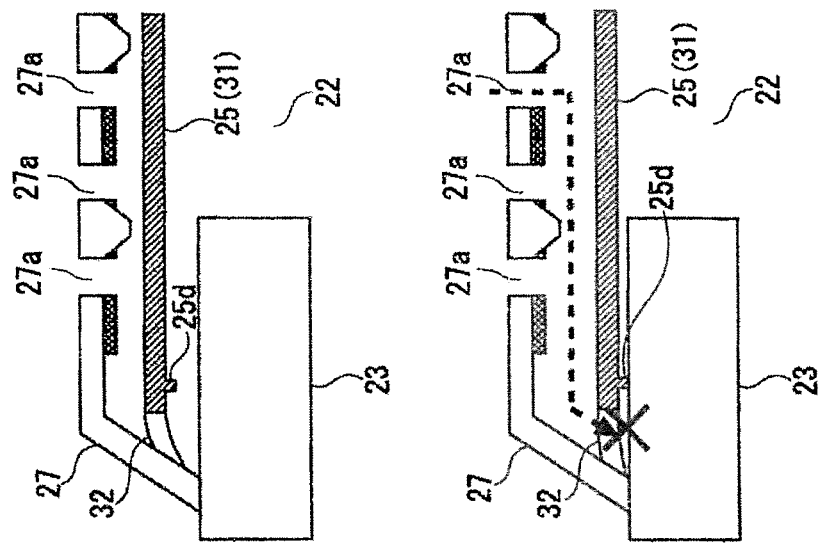
FIG. 13A
FIG. 13B

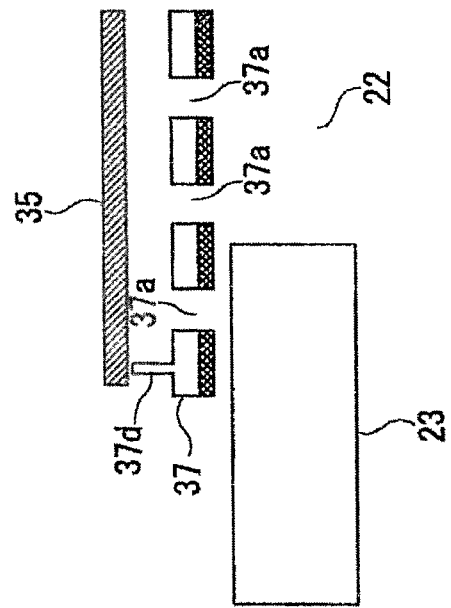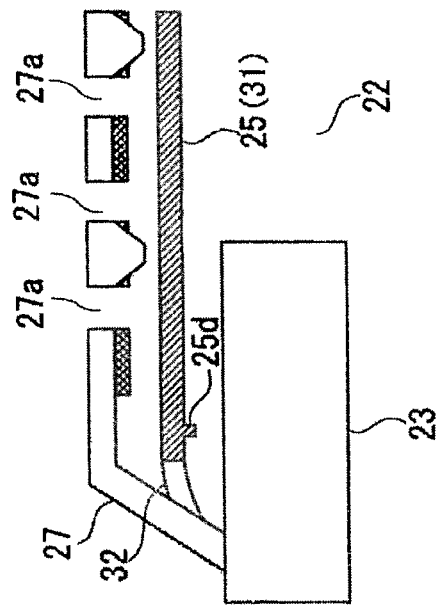

ACOUSTIC SENSOR AND CAPACITIVE TRANSDUCER

CROSS-REFERENCE TO RELATED APPLICATION

This application is based on Japanese Patent Application No. 2016-240655 filed with the Japan Patent Office on Dec. 12, 2016, the entire contents of which are incorporated herein by reference.

BACKGROUND

Field

The present invention relates to an acoustic sensor where a capacitive transducer is housed in a casing, and the capacitive transducer in the acoustic sensor. More specifically, the present invention relates to an acoustic sensor where a capacitive transducer is housed in a casing, the capacitive transducer being configured in a capacitor structure formed by the MEMS technique and including a vibration electrode film and a back plate. Further, the present invention relates to the capacitive transducer.

Related Art

There have been cases where a product using an acoustic sensor, called an ECM (Electret Condenser Microphone), is used as a small-sized microphone. However, the ECM is easily affected by heat, and in terms of digitization support and size reduction, a microphone using a capacitive transducer is more excellent, the capacitive transducer being manufactured by using the MEMS (Micro Electra Mechanical Systems) technique (hereinafter this microphone is also referred to as an MEMS microphone). Thus, in the recent years, the MEMS microphone is being employed (e.g., see Japanese Unexamined Patent Publication No. 2011-250170).

Some of the acoustic sensors as described above house a capacitive transducer having achieved a figuration by using the MEMS technique, the figuration being where a vibration electrode film that vibrates under pressure is disposed facing a back plate fixed with the electrode film via a void. The figuration of the capacitive transducer as thus described can be achieved, for example, by the following step: forming on a silicon substrate a vibration electrode film and such a sacrifice layer as to cover the vibration electrode; forming a back plate on the sacrifice layer; and removing the sacrifice layer. With the semiconductor manufacturing technique applied to the MEMS technique as above, it is possible to obtain an extremely small capacitive transducer.

Meanwhile, since the capacitive transducer prepared by using the MEMS technique is made up of the vibration electrode film and the back plate having been reduced in thickness, the vibration electrode film is liable to be greatly transformed and damaged when excessive pressure acts thereon, or in some other case. This may occur, for example, in a case where large sound pressure is applied into a casing (package) having a pressure hole while the capacitive transducer is housed in the casing. It may also occur in a case where air is blown to the pressure hole of the casing in a package process, or in a case where the capacitive transducer in the state of being housed in the casing falls. This also applies to a case where large sound pressure is applied or air is blown to a mobile electronic device such as a smart phone which includes the capacitive transducer in the state of being housed in the casing, or a case where the device is dropped.

More specifically, when compressed air flows in from the pressure hole that brings air into the capacitive transducer due to collision by falling or the use of an air gun, the vibration electrode film is greatly transformed to the back plate side (opposite the pressure hole) or the substrate side (at this point, the vibration electrode film may be damaged by coming into contact with the back plate or the substrate). The air having entered the capacitive transducer from the pressure hole passes through a gap between the vibration electrode film and the semiconductor substrate or the back plate and/or an opening of the semiconductor substrate or a sound hole of the back plate and gets more deeply into the casing, while transforming the vibration electrode film, to increase the pressure in the casing. When the inflow of the compressed air is ended due to the increased pressure in the casing, the pressure in the casing may cause excessive transformation of the vibration electrode film to the pressure hole side and damage on the vibration electrode film.

In contrast, there is known a technique of mechanically suppressing displacement of a diaphragm to prevent damage due to excessive transformation of the diaphragm (e.g., see US Patent No. 2008/0031476). However, in this technique, the transformation of the diaphragm can be suppressed, but an increase in the pressure itself cannot be prevented. There has thus been a risk that stress concentrates on a part of the diaphragm due to contact between the diaphragm and a transformation suppressing member to cause damage on the diaphragm.

There is also known a technique of disposing a support structure on the substrate side in a diaphragm to prevent collision of the diaphragm with a substrate due to excessive pressure, and damage on the diaphragm (e.g., see US Patent No. 2015/0256924). However, in this technique, the placement of the support structure may complicate the structure to cause deterioration in productivity and an increase in manufacturing cost. Further, Brownian motion of the air present between the diaphragm and the support structure below the diaphragm may cause noise.

SUMMARY

One or more embodiments of the present invention prevents internal pressure of a casing that houses a capacitive transducers from increasing due to compressed air flowing in from a pressure hole of an acoustic sensor, and to prevent a vibration electrode film from being damaged by being excessively transformed to the pressure hole side caused by the pressure. That is, one or more embodiments of the present invention provides a technique by which, when excessive pressure acts on an acoustic sensor, an increase in pressure in a casing is prevented to suppress excessive transformation of a vibration electrode film of a capacitive transducer caused by the increased pressure.

An acoustic sensor according to one or more embodiments of the present invention includes a semiconductor substrate having an opening; a back plate disposed so as to face the opening of the semiconductor substrate, configured to function as a fixed electrode, and having sound holes that allow passage of air; a vibration electrode film disposed so as to face the back plate through a void; and a casing configured to house the substrate, the back plate, and the vibration electrode film, and having a pressure hole that allows inflow of air, the acoustic sensor converting transformation of the vibration electrode film into a change in capacitance between the vibration electrode film and the back plate to detect sound pressure. In the acoustic sensor, a flow path is formed, which includes any of the sound hole of the back plate, a gap between the back plate and the vibration electrode film, a gap between the vibration electrode film and the semiconductor substrate, and the opening of the semiconductor substrate, and in which a fluid flowing into the casing from the pressure hole moves to a space opposite the pressure hole in the casing across the vibration electrode film, and a flow path cutoff part is further provided, being configured to cut off at least a part of the flow path when the vibration electrode film is transformed to come close to the semiconductor substrate or the back plate due to the fluid flowing into the casing from the pressure hole.

When excessive pressure acts on the acoustic sensor, the air having entered the casing of the acoustic sensor from the pressure hole passes through the gap between the vibration electrode film and the semiconductor substrate or the back plate and/or the opening of the semiconductor substrate or the sound hole of the back plate and gets more deeply into the casing, while transforming the vibration electrode film of the capacitive transducer housed in the casing, to increase the pressure, especially in a region opposite the pressure hole across the vibration electrode film in the casing. Then, the vibration electrode film is excessively transformed to the pressure hole side caused by the increased pressure in the casing. In contrast, in one or more embodiments of the present invention, a flow path is formed, which includes any of the sound hole of the back plate, the gap between the back plate and the vibration electrode film, the gap between the vibration electrode film and the semiconductor substrate, and the opening of the semiconductor substrate, and in which a fluid flowing in from the pressure hole to the casing moves to a space opposite the pressure hole across the vibration electrode film in the casing, and a flow path cutoff part is further provided, being configured to cut off at least a part of the flow path when the vibration electrode film is transformed to come close to the semiconductor substrate or the back plate due to the fluid flowing into the casing from the pressure hole. That is, according to one or more embodiments of the present invention, when excessive pressure acts on the acoustic sensor, it is possible to prevent passage of the air through the gap between the vibration electrode film and the semiconductor substrate or the back plate of the capacitive transducer housed in the casing and/or the opening of the semiconductor substrate or the sound hole of the back plate to suppress the increase in the pressure especially in a region opposite the pressure hole across the vibration electrode film in the casing, and to suppress excessive transformation of the vibration electrode film caused by the pressure. It is thereby possible to prevent damage on the vibration electrode film when excessive pressure acts on the acoustic sensor. Note that the meaning of cutting off includes the case of leaving a part of passage of the fluid, in addition to the case of completely blocking passage of the fluid.

Further, in one or more embodiments of the present invention, the flow path cutoff part may be a projection provided in one of the vibration electrode film and the back plate, and configured to block each of at least some of the sound holes in the back plate by abutting with the other of the vibration electrode film and the back plate when the vibration electrode film is transformed to come close to the back plate.

In the configuration where the pressure hole in the casing is positioned opposite the back place across the vibration electrode film, when excessive pressure acts on the acoustic sensor, the vibration electrode film in the capacitive transducer is greatly transformed not to the semiconductor substrate side, but to the back plate side. In such a case, the air passes through the gap between the vibration electrode film and the back plate and/or the sound hole of the back plate and gets more deeply into the casing to increase the pressure in the casing. In contrast, in one or more embodiments of the present invention, when the vibration electrode film transforms and comes close to the back plate, the projection provided in the back plate abuts with the vibration electrode film to block each of at least some of the sound holes in the back plate.

According to this, when excessive pressure acts on the acoustic sensor, it is possible to prevent the air having entered from the pressure hole of the casing from passing through the sound hole of the back plate in the capacitive transducer and getting more deeply into the casing to suppress the increase in the pressure in the casing. It is thereby possible to prevent excessive transformation of the vibration electrode film to the pressure hole side caused by the increased pressure, and to avoid damage on the vibration electrode film.

Further, in one or more embodiments of the present invention, the projection may block each of the sound holes all over the back plate. According to this, when excessive pressure acts on the acoustic sensor, it is possible to more reliably prevent the air from passing through the sound hole of the back plate in the capacitive transducer and getting more deeply into the casing to suppress the increase in the pressure in the casing.

Further, in the present invention, the vibration electrode film may be formed including a plate-shaped vibration part on which pressure acts, and a fixed part configured to fix the vibration part to the semiconductor substrate, and the projection may block the sound hole disposed in a portion in the back plate, the portion facing an outer periphery of the vibration part of the vibration electrode film. When excessive pressure acts on the acoustic sensor and the vibration electrode film in the capacitive transducer is greatly transformed to the back plate side, the air having entered from the pressure hole first gets into the gap between the vibration electrode film and the back plate from the outer periphery of the vibration part of the vibration electrode film. Thereafter, the air passes the sound hole of the back plate and gets more deeply into the casing to increase the pressure in the casing. Therefore, by causing the projection to block the sound hole disposed in the portion in the back plate, the portion facing the outer periphery of the vibration part of the vibration electrode film, it is possible to prevent passage of the air through the sound hole disposed in the vicinity of the outer periphery of the vibration part of the vibration electrode film, and to prevent the flow of the air toward the center of the gap between the vibration electrode film and the back plate. It is thereby possible to more efficiently prevent passage of the air through the sound holes all over the back plate, and more efficiently prevent an increase in the pressure in the casing, and damage on the vibration electrode film caused by the pressure.

Further, in one or more embodiments of the present invention, the projection may have a cylindrical shape enclosing the sound hole in the back plate in a plan view. According to this, when the vibration electrode film is transformed to come close to the back plate, each of the sound holes in the back plate are surrounded by each of the cylindrical projections and the vibration electrode film, thus making it possible to more reliably block the sound holes. As a result, when excessive pressure acts on the acoustic sensor, it is possible to more reliably prevent the air from passing through the sound hole of the back plate and getting more deeply into the casing to suppress the increase in the pressure in the casing.

Further, in the present invention, the vibration electrode film may be formed including a plate-shaped vibration part on which pressure acts, and a fixed part configured to fix the vibration part to the semiconductor substrate or the back plate, and the flow path cutoff part may be a wall provided in one of the vibration electrode film and the back plate, and formed so as to surround at least a part of the vibration part in the vibration electrode film or surround at least a portion in the back plate, the portion facing a part of the vibration part of the vibration electrode film, and when the vibration electrode film is transformed to come close to the back plate, the flow path cutoff part abuts with the other of the vibration electrode film and the back plate to block up at least a part of a flow path for air that passes through the gap between the vibration electrode film and the back plate and/or the sound hole of the back plate.

In this case, when the vibration electrode film comes close to the back plate, the projection does not block each of the sound holes in the back plate, but the wall formed so as to surround at least a portion in the back plate, in which the portion faces a part of the vibration part of the vibration electrode film, blocks all or at least some of the sound holes in the back plate. It is thus possible to more efficiently cut off the flow path for the air (inhibit the flow of the air) passing through the sound hole of the back plate. At the same time, it is possible to more efficiently cut off the flow path for the air passing through the gap between the vibration electrode film and the back plate.

Further, in one or more embodiments of the present invention, the back plate may be provided with a fixed electrode film and the flow path cutoff part, and the fixed electrode film may be provided only in a portion other than a tip of the flow path cutoff part in the back plate. That is, not forming the fixed electrode film at the tip of the flow path cutoff part (e.g., the projection or the wall described above) can prevent occurrence of an electrical short circuit when the flow path cutoff part abuts with the back plate, the semiconductor substrate, the vibration electrode film, or the like.

Further, in one or more embodiments of the present invention, a stopper may further be provided in one of the fixed electrode film and the back plate, the stopper being configured to abut with the other of the fixed electrode film and the back plate when the fixed electrode film and the stopper come close to each other, and the flow path cutoff part may be set as high as or higher than the stopper.

According to this, the flow path cutoff part provided in the vibration electrode film or the back plate can be made higher than the stopper configured to prevent sticking between the vibration electrode film and the back plate when those come close to each other. It is thereby possible to avoid the stopper preventing the flow path cutoff part from abutting with the vibration electrode film or the back plate. Therefore, when excessive pressure acts on the acoustic sensor, it is possible to more reliably prevent an increase in the pressure in the casing and to suppress excessive transformation of the vibration electrode film caused by the above pressure, and to prevent damage on the vibration electrode film at that time.

Further, in the present invention, the vibration electrode film may be formed including a plate-shaped vibration part on which pressure acts, and a fixed part configured to fix the vibration part to the semiconductor substrate or the back plate, and the flow path cutoff part may be a wall provided in one of the vibration electrode film and the semiconductor substrate, and formed so as to surround at least the opening in the semiconductor substrate, or surround at least a portion in the vibration electrode film, the portion facing the opening of the semiconductor substrate, and abuts with the other of the vibration electrode film and the semiconductor substrate to cut off at least a part of a flow path for air that passes through the gap between the vibration electrode film and the semiconductor substrate and/or the opening of the semiconductor substrate when the vibration electrode film is transformed to come close to the semiconductor substrate.

Here, a configuration is assumed where the vibration electrode film is transformed to the semiconductor substrate side opposite the back plate when pressure acts on the acoustic sensor. In this case, the wall as the flow path cutoff part is provided in one of the vibration electrode film and the semiconductor substrate, and formed so as to surround at least the opening in the semiconductor substrate or to surround at least a portion in the vibration electrode film, the portion facing the opening of the semiconductor substrate. Thus, when the vibration electrode film is transformed to come close to the semiconductor substrate, the wall abuts with the other of the vibration electrode film and the semiconductor substrate to cut off the flow path for the air (inhibit the flow of the air) passing through the gap between the vibration electrode film and the semiconductor substrate and/or the opening of the semiconductor substrate. As a result, when excessive pressure acts on the capacitive transducer, it is possible to more reliably prevent the air from passing through the opening of the semiconductor substrate to suppress the increase in the pressure in the casing, and avoid the vibration electrode film being excessively transformed and damaged due to the pressure. Also in this case, the stopper is further provided in one of the vibration electrode film and the semiconductor substrate, the stopper being configured to abut with the other of the vibration electrode film and the semiconductor substrate when the vibration electrode film and the semiconductor substrate come close to each other, and the wall is made as high as or higher than the stopper. It is thereby possible to avoid the stopper preventing the flow path cutoff part from abutting with the vibration electrode film or the back plate.

An acoustic sensor according to one or more embodiments of the present invention includes a semiconductor substrate having an opening; a back plate disposed so as to face the opening of the semiconductor substrate, and having sound holes that allow passage of air; a vibration electrode film disposed so as to face the back plate through a void; and a casing configured to house the substrate, the back plate, and the vibration electrode film, and having a pressure hole that allows inflow of air, the acoustic sensor converting transformation of the vibration electrode film into a change in capacitance between the vibration electrode film and the back plate to detect sound pressure. In the acoustic sensor, a flow path inhibition part may further be provided, being configured to inhibit a flow of a fluid that passes through the opening of the semiconductor substrate or the sound hole of the back plate when the vibration electrode film is transformed to come close to the semiconductor substrate or the back plate.

Also according to this, when excessive pressure acts on the acoustic sensor, it is possible to prevent the air from passing through the opening of the semiconductor substrate or the sound hole of the back plate to increase the pressure in the casing, and to suppress excessive transformation of the vibration electrode film caused by the pressure. It is thereby possible to prevent damage on the vibration electrode film when excessive pressure acts on the acoustic sensor.

A capacitive transducer according to one or more embodiments of the present invention is used by being housed in a casing having a pressure hole that allows inflow of air, the capacitive transducer including: a semiconductor substrate having an opening; a back plate disposed so as to face the opening of the semiconductor substrate, configured to function as a fixed electrode, and having sound holes that allow passage of air; and a vibration electrode film disposed so as to face the back plate through a void. In the capacitive transducer, transformation of the vibration electrode film may be converted into a change in capacitance between the vibration electrode film and the back plate, and a flow path cutoff part may further be provided, being configured to cut off at least a part of a flow path for a fluid that passes through a gap between the vibration electrode film and the semiconductor substrate or the back plate and/or a flow path for a fluid that passes through the opening of the semiconductor substrate or the sound hole of the back plate when the vibration electrode film is transformed to come close to the semiconductor substrate or the back plate.

In the capacitive transducer in one or more embodiments of the present invention, in a case where the capacitive transducer is housed in the casing and used as the acoustic sensor, when excessive pressure acts on the acoustic sensor, it is possible to prevent the air from passing through the gap between the vibration electrode film and the semiconductor substrate or the back plate of the capacitive transducer housed in the casing and/or the opening of the semiconductor substrate or the sound hole of the back plate to suppress the increase in the pressure especially in a region opposite the pressure hole across the vibration electrode film in the casing, and to suppress excessive transformation of the vibration electrode film caused by the pressure. It is thereby possible to prevent damage on the vibration electrode film of the capacitive transducer when excessive pressure acts on the acoustic sensor.

Further, in that case, the flow path cutoff part may be a projection provided in one of the vibration electrode film and the back plate, and configured to block each of at least some of the sound holes in the back plate by abutting with the other of the vibration electrode film and the back plate when the vibration electrode film is transformed to come close to the back plate.

Further, in the capacitive transducer according to one or more embodiments of the present invention, the projection may block each of the sound holes all over the back plate.

Further, in the capacitive transducer according to the present invention, the vibration electrode film may be formed including a plate-shaped vibration part on which pressure acts, and a fixed part configured to fix the vibration part to the semiconductor substrate or the back plate, and the projection may block the sound hole disposed in a portion in the back plate, the portion facing an outer periphery of the vibration part of the vibration electrode film.

Further, in the capacitive transducer according to one or more embodiments of the present invention, the projection has a cylindrical shape enclosing the sound hole in the back plate in a plan view.

Further, in the capacitive transducer according to the present invention, the vibration electrode film may be formed including a plate-shaped vibration part on which pressure acts, and a fixed part configured to fix the vibration part to the semiconductor substrate or the back plate, and the flow path cutoff part may be a wall provided in one of the vibration electrode film and the back plate, and formed so as to surround at least a part of the vibration part in the vibration electrode film or to surround at least a portion in the back plate, the portion facing a part of the vibration part of the vibration electrode film, and abuts with the other of the vibration electrode film and the back plate to cut off at least a part of a flow path for air that passes through the gap between the vibration electrode film and the back plate and/or the sound hole of the back plate when the vibration electrode film is transformed to come close to the back plate.

Further, in the capacitive transducer according to one or more embodiments of the present invention, the back plate may be provided with a fixed electrode film and the flow path cutoff part, and the fixed electrode film may be provided only in a portion other than a tip of the flow path cutoff part in the back plate.

Further, in the capacitive transducer according to one or more embodiments of the present invention, a stopper may further be provided in one of the vibration electrode film and the back plate, the stopper being configured to abut with the other of the vibration electrode film and the back plate when the vibration electrode film and the back plate come close to each other, and the flow path cutoff part may be set as high as or higher than the stopper.

Further, in the capacitive transducer according to the present invention, the vibration electrode film may be formed including a plate-shaped vibration part on which pressure acts, and a fixed part configured to fix the vibration part to the semiconductor substrate or the back plate, and the flow path cutoff part may be a wall provided in one of the vibration electrode film and the semiconductor substrate, and formed so as to surround at least the opening in the semiconductor substrate, or to surround at least a portion in the vibration electrode film, the portion facing the opening of the semiconductor substrate, and abuts with the other of the vibration electrode film and the semiconductor substrate to cut off at least a part of a flow path for air that passes through the gap between the vibration electrode film and the semiconductor substrate and/or the opening of the semiconductor substrate when the vibration electrode film is transformed to come close to the semiconductor substrate.

Further, in the capacitive transducer according to one or more embodiments of the present invention, a stopper may further be provided in one of the vibration electrode film and the semiconductor substrate, the stopper being configured to abut with the other of the vibration electrode film and the semiconductor substrate when the vibration electrode film and the semiconductor substrate come close to each other, and the wall may be set as high as or higher than the stopper.

Further, a capacitive transducer according to one or more embodiments of the present invention is used by being housed in a casing having a pressure hole that allows inflow of air, the capacitive transducer including: a semiconductor substrate having an opening on a surface; a back plate disposed so as to face the opening of the semiconductor substrate, and having sound holes that allow passage of air; and a vibration electrode film disposed so as to face the back plate through a void. In the capacitive transducer, transformation of the vibration electrode film may be converted into a change in capacitance between the vibration electrode film and the back plate, and a flow path inhibition part may further be provided, being configured to inhibit a flow of a fluid that passes through the opening of the semiconductor substrate or the sound hole of the back plate when the vibration electrode film is transformed to come close to the semiconductor substrate or the back plate.

Structures described herein be used in appropriate combination.

According to one or more embodiments of the present invention, it is possible to prevent an increase in pressure in a casing when excessive pressure acts on an acoustic sensor, and to suppress excessive transformation of a vibration electrode film of a capacitive transducer caused by the increased pressure. It is thereby possible to improve tolerance of the acoustic sensor when excessive pressure acts on the acoustic sensor.

BRIEF DESCRIPTION OF THE DRAWINGS

FIGS. 5A to 5C are views illustrating a configuration of the vicinity of the vibration electrode film and the back plate in a first embodiment of the present invention;

FIGS. 7A to 7C are views illustrating a configuration of the vicinity of the vibration electrode film and the back plate in a second embodiment of the present invention;

FIGS. 9A to 9C are views illustrating a configuration of the vicinity of the vibration electrode film and the back plate in a third embodiment of the present invention;

FIGS. 10A to 10C are views illustrating a configuration of the vicinity of the vibration electrode film and the back plate in a fourth embodiment of the present invention;

FIGS. 11A to 11D are views for describing states of tips of the projection/wall and the relation between the stopper and heights of the projection/wall in one or more embodiments of the present invention.

FIGS. 13A to 13C are views illustrating a configuration of the vicinity of the vibration electrode film and the back plate in a fifth embodiment of the present invention;

FIGS. 14A and 14B are views illustrating a configuration of the vicinity of the vibration electrode film and the back plate in the case of provision of a pressure hole on the ceiling surface of the package.

DETAILED DESCRIPTION

Hereinafter, embodiments of the present invention will be described with reference to the drawings. Each of the embodiments shown below is an aspect of the present invention, and is not intended to restrict the technical scope of the present invention. In the following, the case of using a capacitive transducer as an acoustic sensor will be described. However, the capacitive transducer according to the present invention is configured to detect displacement of a vibration electrode film, and can thus be used as a sensor other than the acoustic sensor. For example, it may be used as a pressure sensor, or may be used as an acceleration sensor, an inertia sensor, or some other sensor. It may also be used as an element other than the sensor, such as a speaker for converting an electrical signal into displacement. Further, the placement of a back plate, a vibration electrode film, a back chamber, a semiconductor substrate, and the like in the following description is an example. This placement is not restrictive so long as an equivalent function is exerted. For example, the placement of the back plate and the vibration electrode film may be reversed. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 1:
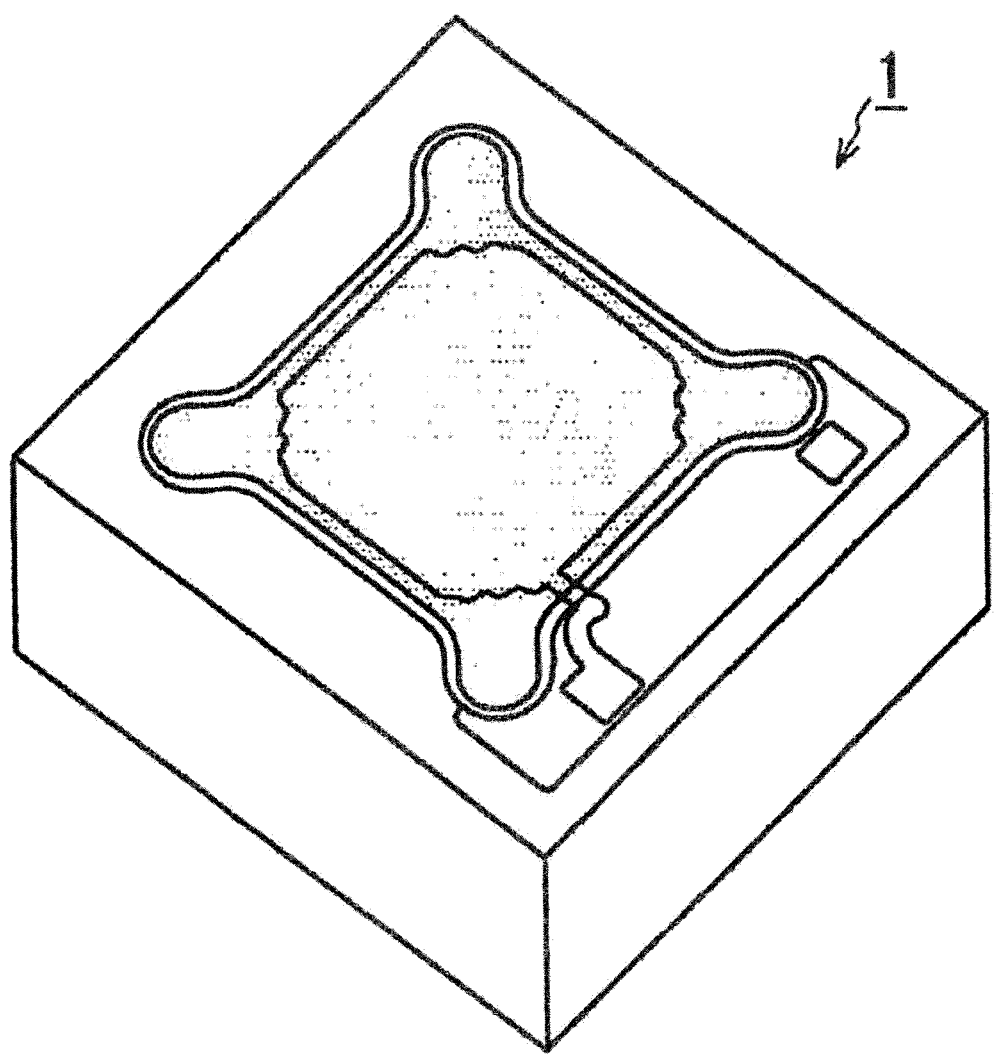
FIG. 1 is a perspective view illustrating an example of a conventional acoustic sensor manufactured by the MEMS technique.
Figure 2:
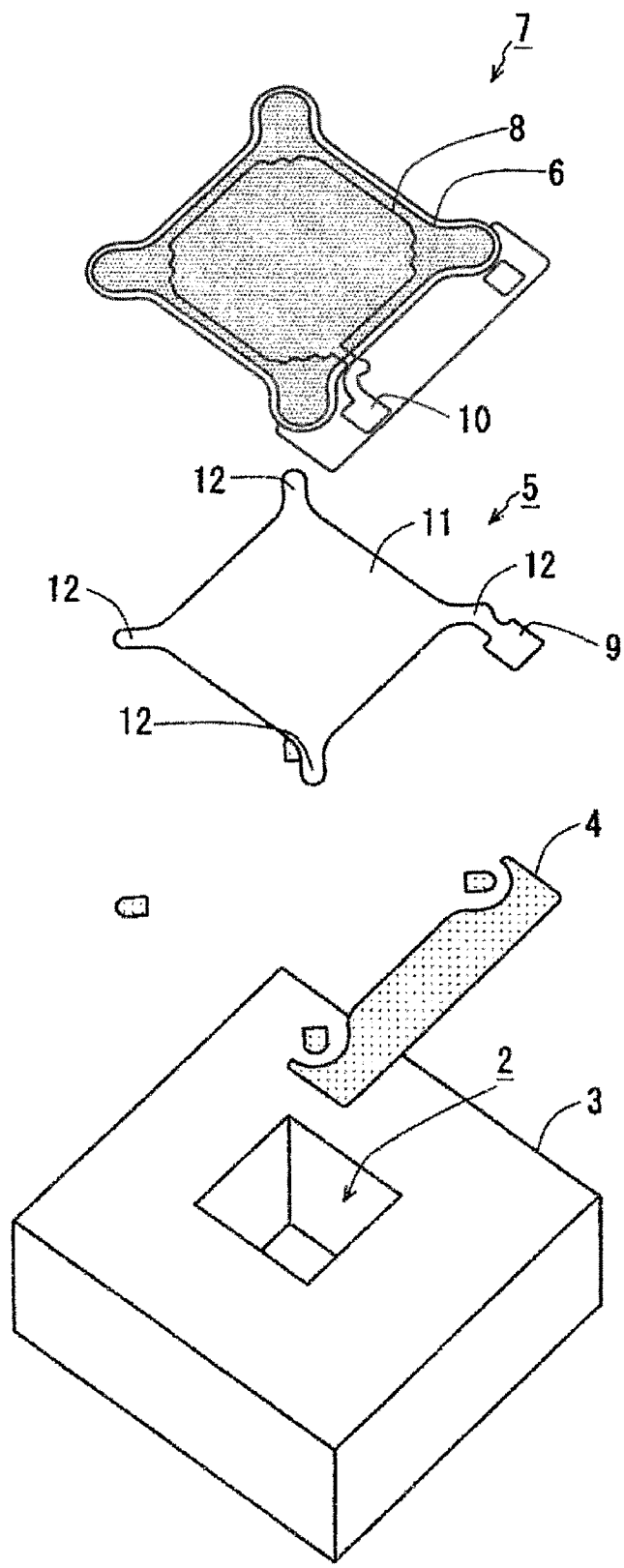
FIG. 2 is an exploded perspective view illustrating an example of an internal structure of the conventional acoustic sensor.

FIG. 1 is a perspective view illustrating an example of a conventional acoustic sensor 1 manufactured by the MEMS technique. FIG. 2 is an exploded perspective view illustrating an example of an internal structure of the acoustic sensor 1. The acoustic sensor 1 is a laminated body formed by laminating an insulating film 4, a vibration electrode film (diaphragm) 5, and a back plate 7 on the top surface of a silicon substrate (hereinafter also referred to simply as a substrate) 3 provided with a back chamber 2. The back plate 7 has a structure where a fixed electrode film 8 is formed on a fixed plate 6, and is formed by disposing the fixed electrode film 8 on the fixed plate 6 on the silicon substrate 3 side. Sound holes are provided all over the fixed plate 6 of the back plate 7 as a large number of punched holes (each of meshed points on the fixed plate 6 illustrated in FIG. 2 corresponds to each of the sound holes). Further, a fixed electrode pad 10 for acquiring an output signal is provided at one of four corners of the fixed electrode film 8.

The silicon substrate 3 can be formed by a single crystal silicon, for example. The vibration electrode film 5 can be formed by conductive polycrystal silicon, for example. The vibration electrode film 5 is a substantially rectangular thin film, in which fixed parts 12 are provided at four corners of a vibration part 11, having a substantially quadrilateral shape, that vibrates. The vibration electrode film 5 is disposed on the top surface of the silicon substrate 3 so as to cover the back chamber 2, and is fixed to the silicon substrate 3 at the four fixed parts 12 as anchor parts. The vibration part 11 of the vibration electrode film 5 reacts sensitively to sound pressure to vibrate vertically.

The vibration electrode film 5 is not in contact with the silicon substrate 3 or the back plate 7 in a place other than the four fixed parts 12. This allows smoother vertical vibration of the vibration electrode film 5 after sensitive reaction to sound pressure. Further, a vibrating membrane electrode pad 9 is provided in one of the fixed parts 12 at the four corners of the vibration part 11. The fixed electrode film 8 provided in the back plate 7 is provided so as to correspond to the vibrating portion of the vibration electrode film 5 except for the fixed parts 12 at the four corners. This is because the fixed parts 12 at the four corners of the vibration electrode film 5 do not react sensitively to sound pressure to vibrate and hence capacitance between the vibration electrode film 5 and the fixed electrode film 8 remains unchanged.

When sound reaches the acoustic sensor 1, the sound passes through the sound hole to apply sound pressure to the vibration electrode film 5. That is, sound pressure is applied to the vibration electrode film 5 through this sound hole. Further, providing the sound hole can facilitate air in an air gap between the back plate 7 and the vibration electrode film 5 to escape to the outside, to reduce thermal noise, leading to noise reduction.

In the acoustic sensor 1, with the structure described above, the vibration electrode film 5 vibrates upon receipt of sound, and the distance between the vibration electrode film 5 and the fixed electrode film 8 changes. When the distance between the vibration electrode film 5 and the fixed electrode film 8 changes, capacitance between the vibration electrode film 5 and the fixed electrode film 8 changes. Hence it is possible to detect sound pressure as an electrical signal by previously applying a direct-current voltage between the vibrating membrane electrode pad 9 electrically connected with the vibration electrode film 5 and the fixed electrode pad 10 electrically connected with the fixed electrode film 8, and taking out the above-mentioned change in capacitance as an electrical signal.

Figure 3A:
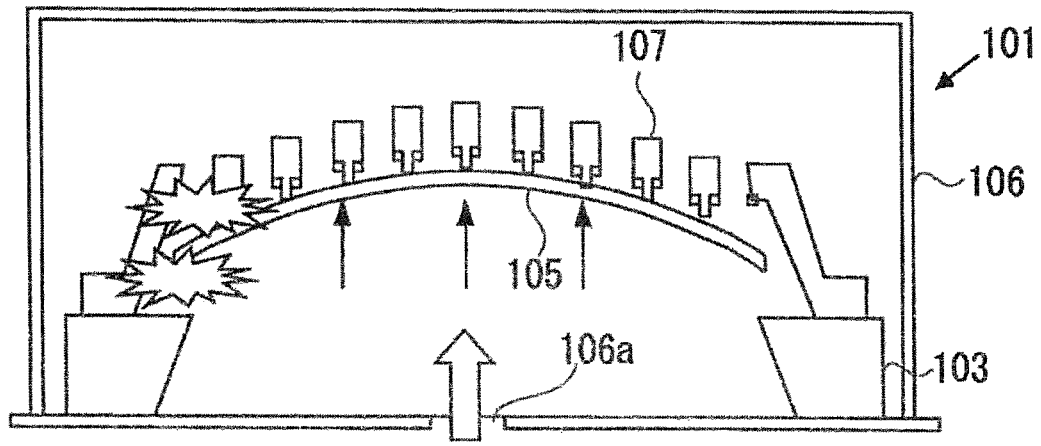
FIGS. 3A to 3C are views for describing a case of excessive pressure abruptly acting on the acoustic sensor.
Figure 3B:
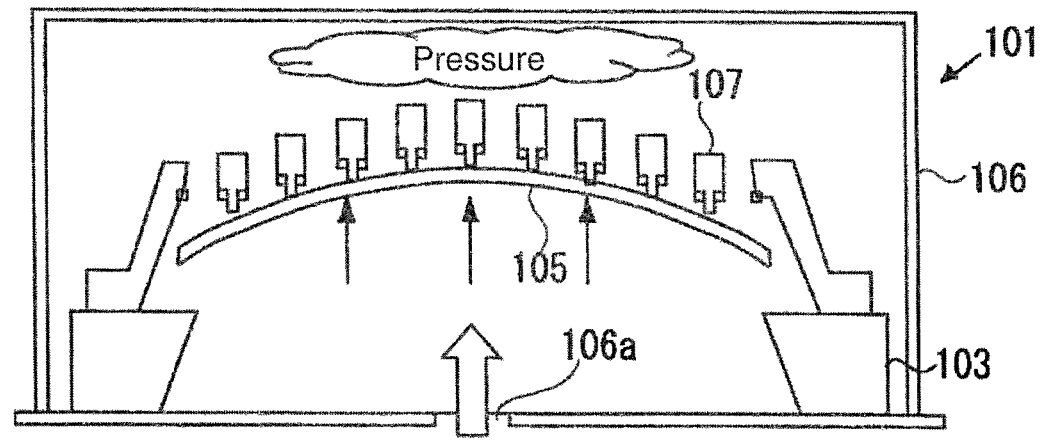
Figure 3C:
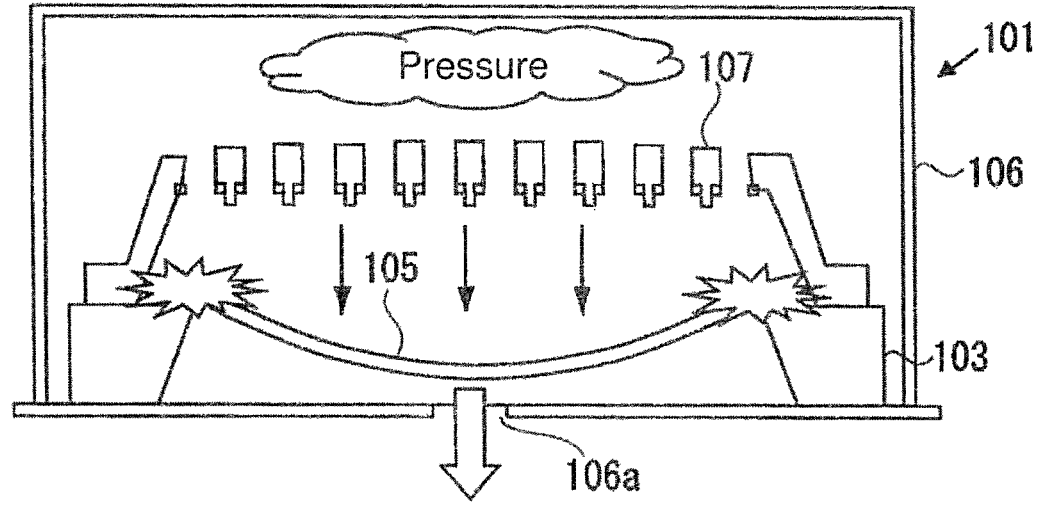

Next, a description will be given of an operation of the above conventional acoustic sensor 1. FIGS. 3A to 3C are schematic views describing the case of excessive pressure acting on the acoustic sensor 1. As illustrated in FIGS. 3A to 3C, when excessive pressure acts on the acoustic sensor 1, the pressure acts on a vibration electrode film 105 from a pressure hole 106a provided at the bottom surface of a package 106 as the casing. Then, the vibration electrode film 105 is greatly transformed to the back plate 107 side (opposite the pressure hole 106a), and the vibration electrode film 105 comes into contact with the back plate 107. The vibration electrode film 105 may be damaged at that time.

Further, the air flowing in from the pressure hole 106a in the above process passes through the gap between the vibration electrode film 105 and the back plate 107, further passes through a sound hole 107a of the back plate 107, and gets more deeply into the casing, to be compressed. Since this increases the pressure in the package 106, when the inflow of the air is ended, the increase in the pressure in the package 106 may then cause large transformation of the vibration electrode film 105 to the side opposite the back plate 107 (to the pressure hole 106a side), causing damage on the vibration electrode film 105. This may occur, for example, in a case where the acoustic sensor 1 falls or some other case in addition to the case where excessive air pressure acts on the acoustic sensor 1.

Figure 4A:
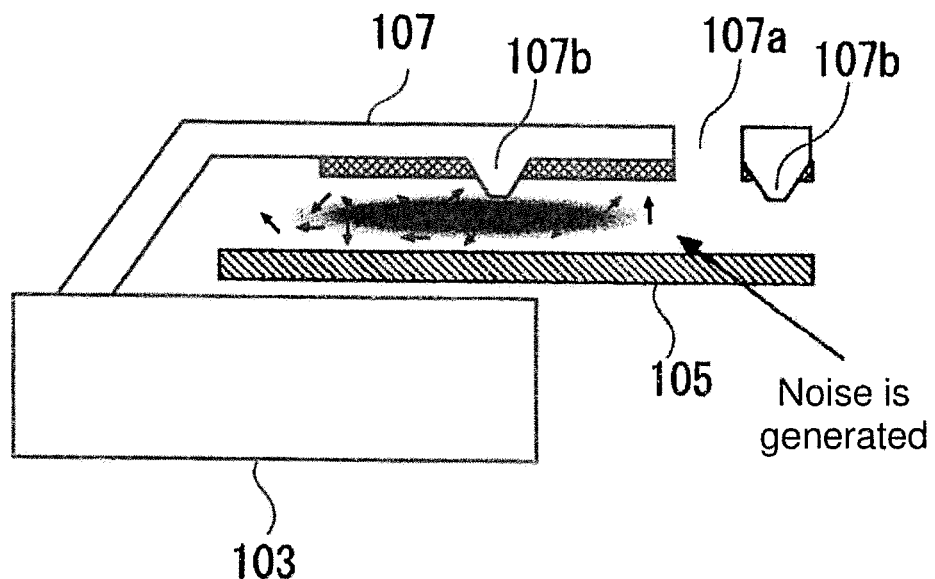
FIGS. 4A and 4B are views for describing a conventional measure against the case of excessive pressure abruptly acting on the acoustic sensor.
Figure 4B:
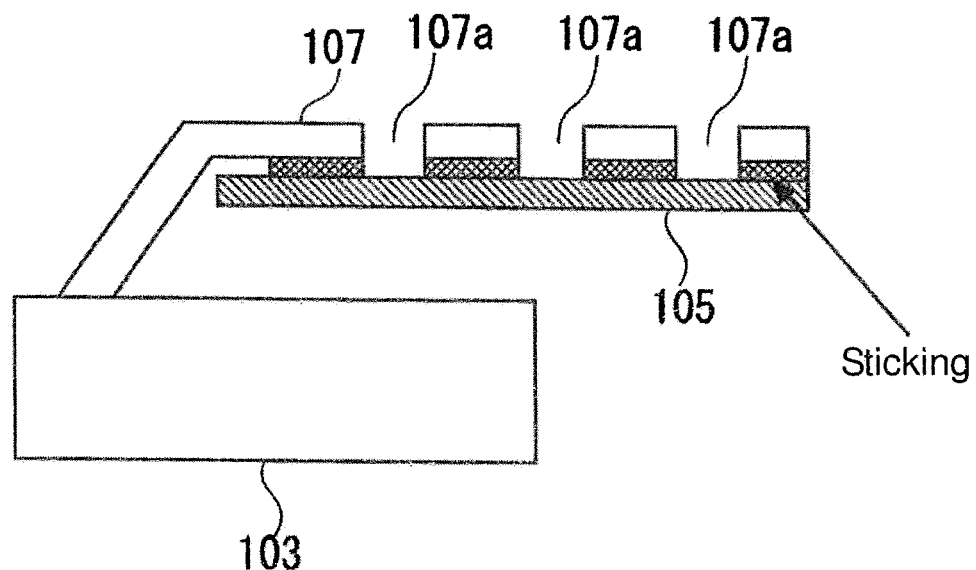

In view of the increase in the pressure in the package 106, measures as illustrated in FIGS. 4A and 4B are considered. That is, as illustrated in FIG. 4A, by eliminating the sound hole 107a in a portion in the back plate 107, the portion facing the vicinity of the end of the vibration electrode film 105, it is possible to make it difficult for the air to pass through the back plate 107 via the sound hole 107a when excessive pressure acts from the pressure hole 106a.

However, in this case, since the air is accumulated between the vibration electrode film 105 and the back plate 107 in the vicinity of the end of the vibration electrode film 105, noise tends to occur due to Brownian motion of the air. Further, as illustrated in FIG. 4B, by eliminating a stopper 107b of the back plate 107, when the vibration electrode film 105 is transformed to the back plate 107 side, it is possible to bring the whole surfaces of the vibration electrode film 105 and the back plate 107 into intimate contact with each other and make it difficult for the air to pass through the back plate 107 via the sound hole 107a. However, in this case, the vibration electrode film 105 and the back plate 107 are liable to stay in intimate contact and become unable to be separated, thus causing occurrence of sticking.

Accordingly, in a first embodiment of the present invention, a projection is provided in the back plate, the projection cylindrically projecting to the vibration electrode film side so as to enclose the sound hole. Namely, it is configured such that, when the vibration electrode film is transformed to the back plate side, the vibration electrode film abuts with the tip of the projection to block the sound hole and prevent passage of the air through the sound hole and through the back plate, and thereby prevent an increase in the pressure in the package.

FIGS. 5A to 5C are views for describing a structure of the vicinity of a back plate 27 and a vibration electrode film 25 in the first embodiment. FIG. 5A is a sectional view illustrating a state before excessive pressure acts, FIG. 5B is a sectional view illustrating a state where the excessive pressure has acted, and FIG. 5C is a plan view. Note that FIGS. 5A and 5B are sectional views along an X-X cross section indicated in FIG. 5C. In FIG. 5A, numeral 23 denotes a substrate, numeral 29 denotes a vibrating membrane electrode pad, numeral 30 denotes a fixed electrode pad, numeral 31 denotes a vibration part in the vibration electrode film 25, and numeral 32 denotes a fixed part in the vibration electrode film 25. As illustrated in FIG. 5A, a projection 27c having a cylindrical shape is provided in the back plate 27 so as to enclose a sound hole 27a close to the end of the vibration electrode film 25 among sound holes 27a in the back plate 27.

Accordingly, when excessive pressure acts and the vibration electrode film 25 is transformed to the back plate 27 side, the vibration electrode film 25 abuts with the projection 27c to block the sound hole 27a, and can thus prevent the air from passing through the sound hole 27a to suppress the increase in the internal pressure of the package in terms of a region close to the end of the vibration electrode film 25. Further, the presence of the projection 27c makes it difficult for the air to get into the gap between the back plate 27 and the vibration electrode film 25, and to reach the sound hole 27a disposed in a region close to the center of the vibration electrode film 25. It is thereby possible to prevent the air from passing through the sound hole 27a in the region to suppress the increase in the internal pressure of the package.

Note that the projection 27c may be provided at the sound hole 27a in a region A enclosing the vibration part 31 of the vibration electrode film 25, indicated by a dotted line in FIG. 5C, or may be provided at the sound hole 17a in a region extended in the center of the vibration part 31. The projection 27c may also be provided at the sound holes 27a in the whole region of the vibration part 31. Further, among the sound holes 27a in the above region, the projection 27c may be provided at each of all the sound holes 27a, or may be provided at each of some of the sound holes 27a. The size of the region provided with the projection 27c and the number of sound holes 27a provided with the projection 27c may be appropriately decided based on the degree of increase in the pressure in the package, the degree of occurrence of sticking, and the like, when excessive pressure acts on the acoustic sensor 1.

Figure 6B:
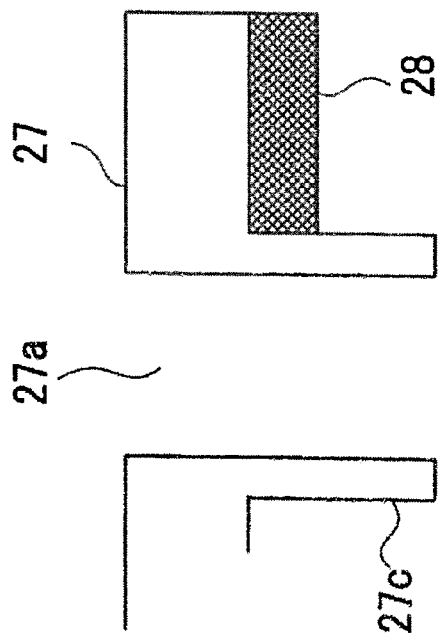
FIGS. 6A to 6C are views illustrating a configuration of a projection in the first embodiment of the present invention.
Figure 6C:
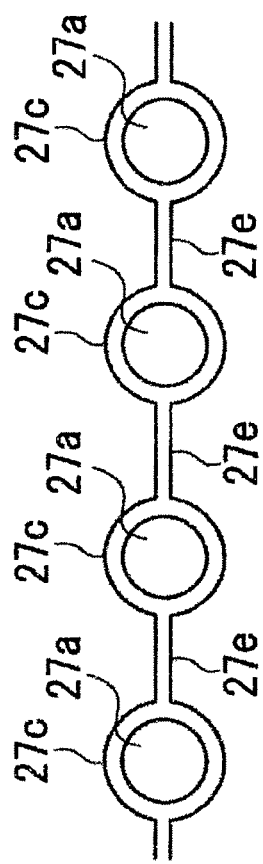
Figure 6A:
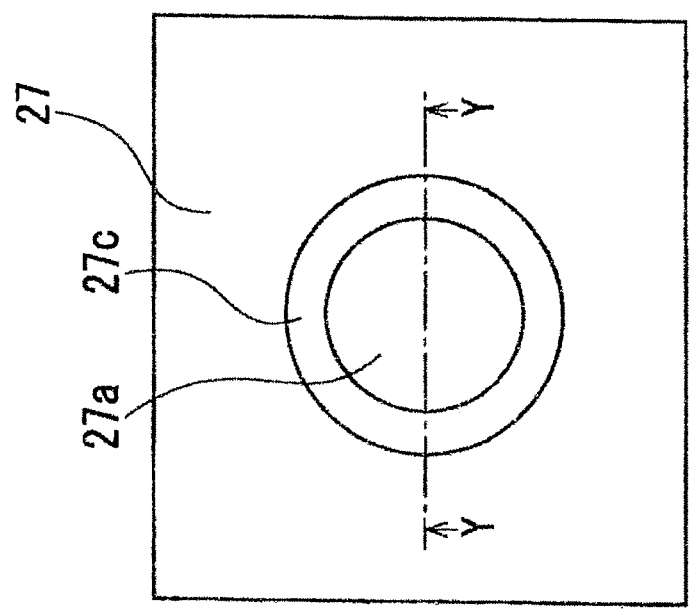

FIGS. 6A to 6C illustrate enlarged views of the sound hole 27a and the projection 27c. FIG. 6A is a plan view, and FIG. 6B is a Y-Y sectional view. As illustrated in FIG. 6A, the projection 27c is provided so as to enclose the sound hole 27a in a plan view, and has a cylindrical shape when the sound hole 27a has a circular shape. Note that in the first embodiment, wall-shaped walls 27e link the projections 27c having a cylindrical shape as illustrated in the plan view of FIG. 6C. It is thereby possible to more reliably prevent the air from passing through the gap between the back plate 27 and the vibration electrode film 25 and through the sound hole 27a to suppress the increase in the pressure in the package. Note that the projection 27c and the wall 27e correspond to the flow path cutoff part and the flow path inhibition part in the present invention.

Next, as a second embodiment, a description will be given of an example where a wall is provided so as to surround a portion in the back plate 27, the portion facing the vibration part 31 of the vibration electrode film 25, so as to make it difficult for the air to pass through the sound hole 27a when excessive pressure acts on the acoustic sensor 1 and the vibration electrode film 25 is transformed to the back plate 27 side.

FIGS. 7A to 7C are views for describing a structure of the vicinity of the back plate 27 and the vibration electrode film 25 in the second embodiment. FIG. 7A is a sectional view illustrating a state before excessive pressure acts, FIG. 7B is a sectional view illustrating a state where the excessive pressure has acted, and FIG. 7C is a plan view. Note that FIGS. 7A and 7B are sectional views along an X-X cross section indicated in FIG. 7C. In the second embodiment, as illustrated in FIG. 7A, a wall 27d is provided so as to surround a region, which is a portion facing the vibration part 31 of the vibration electrode film 25 and in which the sound holes 27a are distributed, in the back plate 27.

Figure 8A:
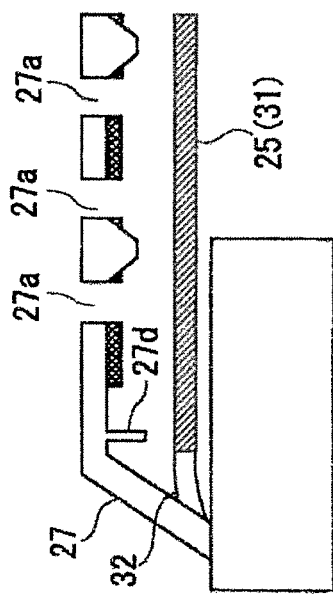
FIGS. 8A to 8C are views illustrating another configuration of the vicinity of the vibration electrode film and the back plate in the second embodiment of the present invention.
Figure 8B:
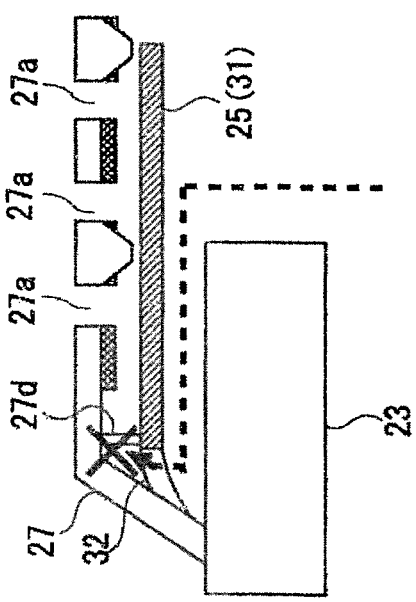
Figure 8C:
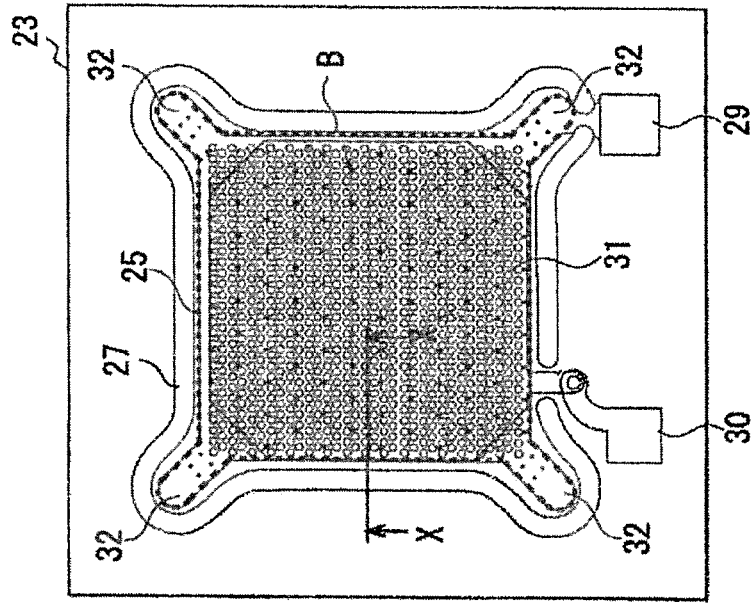

Accordingly, when excessive pressure acts and the vibration electrode film 25 is transformed to the back plate 27 side, the vibration part 31 of the vibration electrode film 25 abuts with the tip of the wall 27d to cut off a flow path for the air (inhibit the flow of the air) toward the region where the sound holes 27a are distributed in the back plate 27. It is thereby possible to prevent the air from passing through the sound hole 27a to suppress the increase in the pressure in the package. Note that the wall 27d may be provided so as to surround a region B including all the sound holes 27a in FIG. 7C, or some of the sound holes 27a may be distributed outside the region surrounded by the wall 27d. The wall 27d may be provided so as to surround the whole of the vibration electrode film 25 including the fixed portion 32, as illustrated in FIG. 8C.

Next, a description will be given of an example where a projection is provided in the vibration electrode film. FIGS. 9A to 9C are views for describing a structure of the vicinity of the back plate 27 and the vibration electrode film 25 in a third embodiment. FIG. 9A is a sectional view illustrating a state before excessive pressure acts, FIG. 9B is a sectional view illustrating a state where the excessive pressure has acted, and FIG. 9C is a plan view. Note that FIGS. 9A and 9B are sectional views along an X-X cross section indicated in FIG. 9C. In the third embodiment, as illustrated in FIG. 9A, a projection 25a is provided in a position where each of the sound holes 27a disposed in the facing back plate 27 can be blocked in the vicinity of the end of the vibration part 31 of the vibration electrode film 25. That is, in a plan view, there has been provided the projection 25a having such a cross section in a columnar shape as to include each of the sound holes 27a.

Accordingly, as illustrated in FIG. 9B, when excessive pressure acts and the vibration electrode film 25 is transformed to the back plate 27 side, among the sound holes 27a in the back plate 27, the projection 25a provided in the vibration electrode film 25 can block particularly the sound hole 27a disposed in a portion facing the vicinity of the end of the vibration part 31 of the vibration electrode film 25, which tends to be a flow path for the air. It is thereby possible to block the sound hole 27a disposed in the portion facing the vicinity of the end of the vibration part 31 of the vibration electrode film 25, and also possible to cut off a flow path for the air (inhibit the flow of the air) flowing into the gap between the vibration electrode film 25 and back plate 27 on the center side of the vibration electrode film 25. It is thereby possible to more efficiently prevent the air from passing through the sound hole 27a to suppress the increase in the pressure in the package.

Note that in the vibration electrode film 25, the projection 25a may be provided at the sound hole 27a in a region A enclosing the vibration part 31 of the vibration electrode film 25, indicated by a dotted line in FIG. 9C, or may be provided at the sound hole 27a in a region extended in the center of the vibration part 31. The projection 25a may be provided at each of the sound holes 27a facing the whole region of the vibration part 31 (i.e., at each of all the sound holes 27a disposed in the back plate 27). Further, among the sound holes 27a in the above region, the projection 25a may be provided at each of all the sound holes 27a, or may be provided at each of some of the extracted sound holes 27a. The size of the region provided with the projection 25a and the number of sound holes 27a provided with the projection 25a may be appropriately decided based on the degree of increase in the pressure in the package, the degree of occurrence of sticking, and the like, when excessive pressure acts on the acoustic sensor 1.

In the third embodiment, the projection 25a having a columnar shape is provided in the vibration electrode film 25, the projection 25a being able to block each of the sound holes 27a in the facing back plate 27. However, the projection 25a may have a columnar shape being able to block a plurality of sound holes 27a. Alternatively, for example, a wall is provided so as to surround at least a part of the vibration part 31 of the vibration electrode film 25, and when excessive pressure acts and the vibration electrode film 25 is transformed to the back plate 27 side, the sound hole 27a facing the region surrounded by this wall may be blocked.

Next, a case will be described where the present invention is applied to a structure where a hole 25b is provided in the vibration electrode film 25. Such a structure may be employed for the purpose of decreasing the sensitivity of a low-frequency region of the acoustic sensor 1. FIGS. 10A to 10C illustrate a structure of a projection 25c in the structure where the hole 25b is provided in the vibration electrode film 25. In such a case, as illustrated in FIG. 10A, the projection 25c having a cylindrical shape may be provided in the vibration electrode film 25 so as to enclose the hole 25b. Accordingly, when excessive pressure acts and the vibration electrode film 25 is transformed to the back plate 27 side, the projection 25c of the vibration electrode film 25 abuts with the back plate 27 to cut off a flow path for the air (inhibit the flow of the air) by the hole 25b in the vibration electrode film 25, so as to make it possible to prevent the air from passing through the hole 25b to suppress the increase in the pressure in the package.

Further, as illustrated in FIG. 10B, a projection 27e may be provided in the back plate 27, the projection 27e having a cross section that includes the hole 25b in a plan view. Accordingly, when excessive pressure acts and the vibration electrode film 25 is transformed to the back plate 27 side, the projection 27e of the back plate 27 abuts with the vibration electrode film 25 to cut off a flow path for the air (inhibit the flow of the air) by the hole 25b in the vibration electrode film 25, so as to make it possible to prevent the air from passing through the hole 25b to suppress the increase in the pressure in the package.

Alternatively, as illustrated in FIG. 10C, a projection 27f may be provided in the back plate 27, the projection 27f having a cross section slightly smaller than the hole 25b in a plan view. Accordingly, when excessive pressure acts and the vibration electrode film 25 is transformed to the back plate 27 side, the projection 27f of the back plate 27 gets into the hole 25b in the vibration electrode film 25 to cut off a flow path for the air (inhibit the flow of the air), so as to make it possible to prevent the air from passing through the hole 25b to suppress the increase in the pressure in the package. Further, in this case, the risk of occurrence of sticking can be reduced by the projection abutting with the vibration electrode film 25. In the fourth embodiment illustrated in FIGS. 10A to 10C, the flow path for the air passing through the hole 25b in the vibration electrode film 25 is cut off (the flow of the air is inhibited) directly. In the meantime, this indirectly cuts off at least a part of a flow path for a fluid passing through the gap between the vibration electrode film 25 and the back plate 27 and/or a flow path for a fluid passing through the sound hole of the back plate 27.

In one or more of the above embodiments, the fixed electrode film is not provided in a portion in contact with the vibration electrode film, such as the tips of the projection and the wall provided on the back plate side (see FIG. 11A).

Accordingly, for example, even when the wall 27d illustrated in FIG. 11A comes into contact with the vibration electrode film 25 at the time of excessive pressure acting on the acoustic sensor 1, it is possible to prevent occurrence of an electrical short circuit between the vibration electrode film 25 and the back plate 27.

Further, FIGS. 11B to 11D illustrate the relation of height between the wall 27d provided in the back plate 27 and a stopper 27b. In FIG. 11B, the wall 27d is higher than the stopper 27b. In FIG. 11O, the wall 27d is as high as the stopper 27b. In these cases, when excessive pressure acts and the vibration electrode film 25 is transformed to the back plate 27 side, the wall 27d reaches the vibration electrode film 25 earlier than or simultaneously with the stopper 27b. This allows the wall 27d and the vibration electrode film 25 to more reliably abut with each other. As a result, when excessive pressure acts on the acoustic sensor 1, it is possible to more reliably prevent the air from passing through the sound hole 27a to suppress the increase in the pressure in the package.

On the other hand, as illustrated in FIG. 11D, in a case where the wall 27d is lower than the stopper 27b, when excessive pressure acts and the vibration electrode film 25 is transformed to the back plate 27 side, the stopper 27b reaches the vibration electrode film 25 earlier than the wall 27d, thus making it difficult for the wall 27d and the vibration electrode film 25 to reliably abut with each other. As a result, when excessive pressure acts on the acoustic sensor 1, it is difficult to reliably prevent an increase in the pressure in the package due to passage of the air through the sound hole 27a.

According to one or more embodiments of the present invention, the wall 27d is made higher than the stopper 27b as illustrated in FIG. 11B, or make the wall 27d as high as the stopper 27b as illustrated in FIG. 11C. This also applies to the case where the projection is provided in the back plate 27.

Figure 12A:
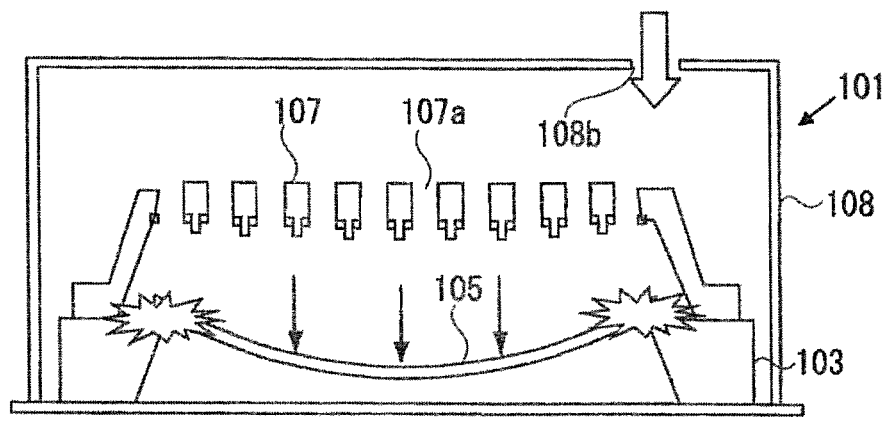
FIGS. 12A to 12C are second views for describing a case of excessive pressure abruptly acting on the acoustic sensor.
Figure 12B:
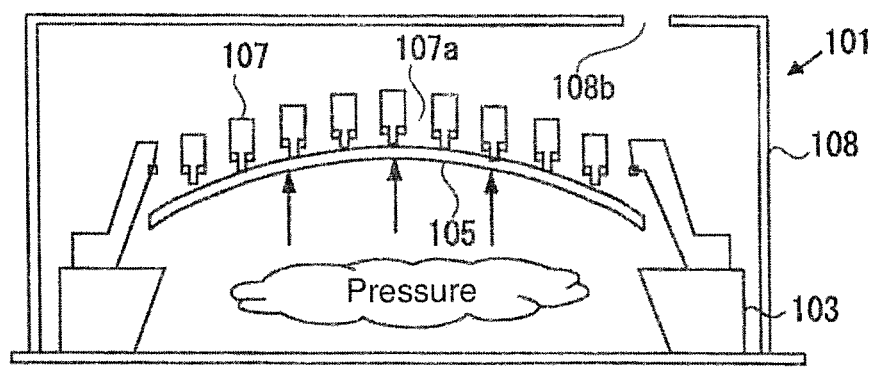
Figure 12C:
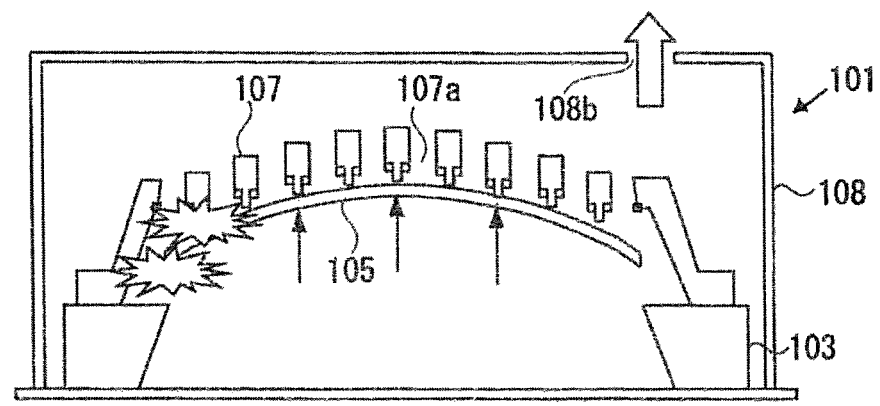

Next, a case will be described where the present invention is applied to a configuration where a pressure hole 108b is present not on the bottom surface side (the substrate side with respect to the vibration electrode film) but on the ceiling surface side (opposite the substrate across the vibration electrode film) in a package 108. With reference to FIG. 12, a description will be given of a case of the excessive pressure acting on an acoustic sensor 101 in this configuration. When excessive pressure acts on the acoustic sensor 1 in this configuration, the pressure acts on the vibration electrode film 105 from the pressure hole 108b provided on the ceiling surface of the package 108 via the sound hole 107a of the back plate 107. Then, the vibration electrode film 105 is greatly transformed to the side opposite the back plate 107 (to the substrate 103 side), and the vibration electrode film 105 comes into contact with the substrate 103. The vibration electrode film 105 may be damaged at this point.

Further, the air flowing in from the pressure hole 108b in the above process passes through the gap between the vibration electrode film 105 and the substrate 103, further passes through the opening of the substrate 103, and gets more deeply into the casing, to be compressed. Since the pressure in the package 108 thereby increases, when the inflow of the air is ended, the vibration electrode film 105 is greatly transformed to the back plate 107 side this time, to come into contact with the back plate 107. The vibration electrode film 105 may be damaged at that time.

In view of the above, in a fifth embodiment, when the pressure hole is present not on the substrate side but on the opposite side of the substrate across the vibration electrode film in the package, the wall is provided in the vibration electrode film on the substrate side, so as to make it difficult for the air to pass through an opening of the back chamber in the substrate to increase the pressure in the package.

FIGS. 13A to 13C are views for describing a structure of the vicinity of the back plate 27 and the vibration electrode film 25 in the fifth embodiment. FIG. 13A is a sectional view illustrating a state before excessive pressure acts, FIG. 13B is a sectional view illustrating a state where the excessive pressure has acted, and FIG. 13C is a plan view. Note that FIGS. 13A and 13B are sectional views along an X-X cross section indicated in FIG. 13C. In the fifth embodiment, as illustrated in FIG. 13A, a wall 25d is provided in a portion, which faces a substrate 23, in the vibration electrode film 25 so as to surround a back chamber 22.

Accordingly, when excessive pressure acts and the vibration electrode film 25 is transformed to the substrate 23 side, as illustrated in FIG. 13B, the wall 25d of the vibration electrode film 25 abuts with the top surface of the substrate 23 to cut off a flow path for the air (inhibit the flow of the air) toward the back chamber 22, thereby enabling prevention of an increase in the pressure in the package. Note that the wall 25d is provided so as to surround the opening of the back chamber 22 that is substantially square in a plan view, as indicated by a chain double-dashed line in FIG. 13C. Although the wall 25d is formed in a closed curve in a plan view in this case, the wall 25d may have a gap in a part thereof. Further, in the fifth embodiment, a stopper (not illustrated) may be provided on the surface of the vibration electrode film 25 on the substrate 23 side in order to prevent occurrence of sticking between the vibration electrode film 25 and the substrate 23. In this case, according to one or more embodiments of the present invention, the wall 25d is made as high as or higher than the stopper. Accordingly, when excessive pressure acts and the vibration electrode film 25 is transformed to the substrate 23 side, it is possible to more reliably cause the wall 25d of the vibration electrode film 25 to abut with the top surface of the substrate 23, and to prevent an increase in the pressure in the package.

When the pressure hole is provided on the ceiling surface of the package, there is considered a configuration where the back plate 27 is disposed in the vibration electrode film 25 on the ceiling surface side (i.e., on the pressure hole side) as illustrated in FIGS. 13A to 13C and FIG. 14A, or a configuration where a vibration electrode film 35 is disposed in a back plate 37 on the ceiling surface side (i.e., on the pressure hole side) as illustrated in FIG. 14B. In such a case as illustrated in FIG. 14B, a wall 37d may be provided so as to surround a region where a sound hole 37a is disposed in the back plate 37. Although not illustrated, a cylindrical projection may be provided in the back plate 37 so as to surround the sound hole 37a. Further, such a projection as to block the sound hole 37a may be provided in the vibration electrode film 35.

MODIFIED EXAMPLE

In one or more of the above embodiments, the description has been given assuming that the projection or the wall is formed by adding a projected shape to the surface of the back plate or the vibration electrode film. However, the projection or the wall may be formed by adding a curved shape to the back plate or the vibration electrode film.

Figure 15A:
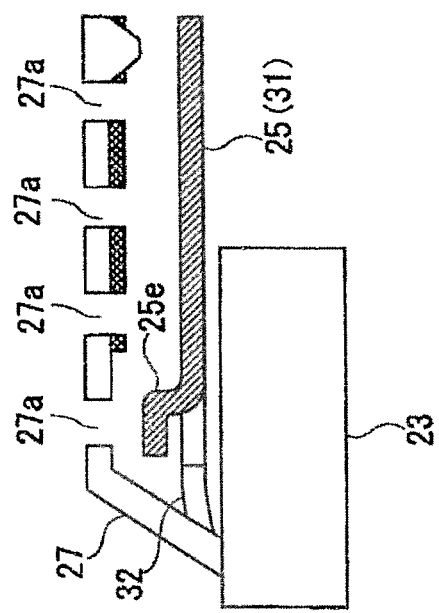
FIGS. 15A and 15B are views illustrating a configuration of the vicinity of the vibration electrode film and the back plate in a modified example of the present invention.
Figure 15B:
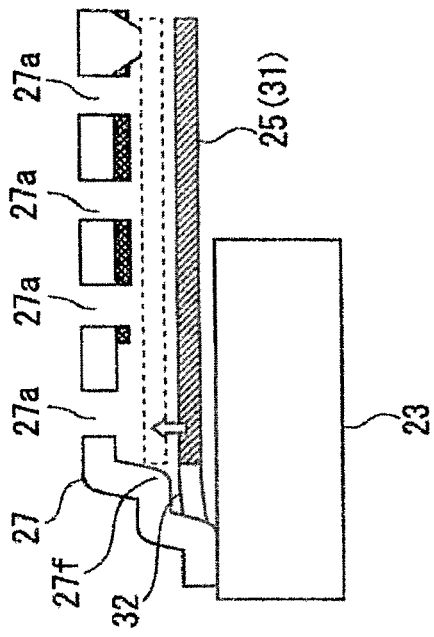

Each of FIGS. 15A and 15B illustrates a sectional view of the vicinity of the back plate and the vibration electrode film in such a modified example. FIG. 15A is an example where a curved shape is added to the obliquely formed side surface of the back plate 27 to form a wall 27f. In this example, when excessive pressure acts on the acoustic sensor 1 and the vibration electrode film 25 is transformed to the back plate 27 side, the end surface of the vibration part 31 comes close to the wall 27f, to cut off a flow path (inhibit the flow) at the time of the air flowing into the gap between the back plate 27 and the vibration electrode film 25 and prevent passage of the air through the sound hole 27a. It is thereby possible to prevent an increase in the pressure in the package.

In this modified example, when the curved shape is added to the vibration electrode film 25 on the back plate 27 side, the end surface of the vibration part 31 comes close to the wall 27f, to cut off a flow path (inhibit the flow) at the time of the air flowing into the gap between the back plate 27 and the vibration electrode film 25. In contrast, when the curved shape is extended in the wall 27f to the more central side of the vibration electrode film 25 and the vibration electrode film 25 is transformed to the back plate 27 side, the surface of the vibration electrode film 25 on the back plate 27 side may abut with the wall 27f, to cut off the flow path (inhibit the flow) at the time of the air flowing into the gap between the back plate 27 and the vibration electrode film 25.

Next, FIG. 15B is an example where a projection 25e of the vibration electrode film 25 is formed by adding a curved shape to a part of the end of the vibration part 31 in the vibration electrode film 25. Also in this example, when excessive pressure acts on the acoustic sensor 1 and the vibration electrode film 25 is transformed to the back plate 27 side, the projection 25e blocks the sound hole 27a of the back plate 27, to cut off a flow path (inhibit the flow) at the time of the air flowing into the gap between the back plate 27 and the vibration electrode film 25 and prevent passage of the air through the sound hole 27a. It is thereby possible to prevent an increase in the pressure in the package.

In one or more of the above embodiments, the example has been described where excessive pressure acts on the acoustic sensor 1 and the air flows in from the pressure hole. However, the present invention is also applicable to a case where the acoustic sensor 1 is used in an atmosphere other than the air. That is, the flow path cutoff part and the flow path inhibition part in the present invention may cut off a flow path for a fluid other than the air or inhibit the flow of the fluid.

Figure 16A:
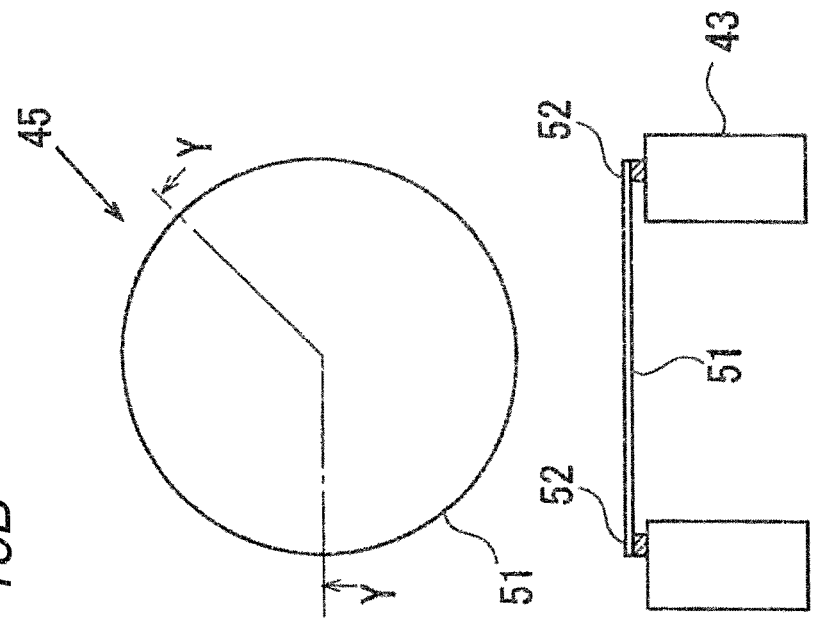
FIGS. 16A and 16B are views illustrating another example of the vibration electrode film according to one or more embodiments of the present invention.
Figure 16B:
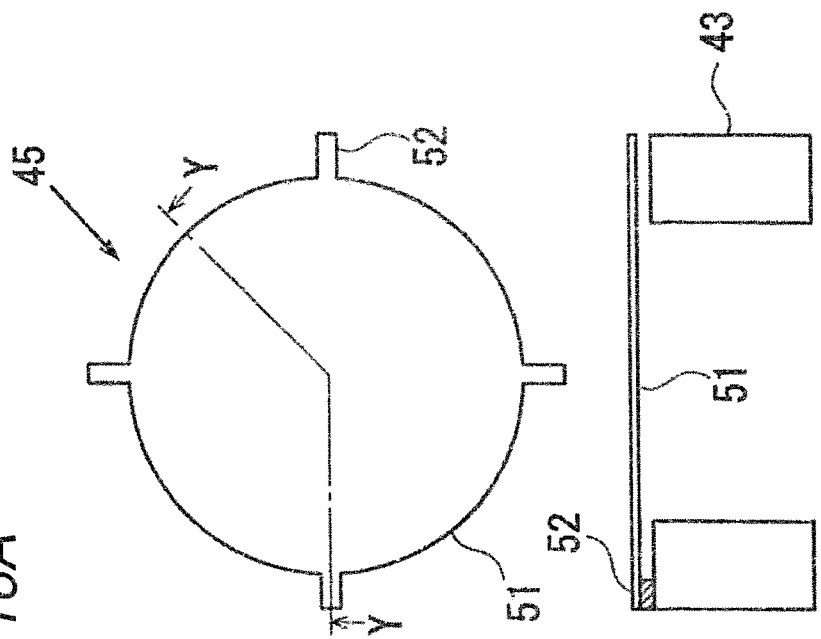

In one or more of the above embodiments, the example has been described where the vibration part of the vibration electrode film has been in a substantially square shape and the fixed parts have been formed on its periphery. However, the vibration part of the vibration electrode film may be in a circular shape as illustrated in FIGS. 16A and 16B or other shapes. For example, one or more fixed parts 52 may be provided on the periphery of the circular vibration part 51 in a vibration electrode film 45 so as to radially extend as illustrated in FIG. 16A, or an outer peripheral portion of the circular vibration part 51 in the vibration electrode film 45 may directly function as the fixed part 52 that is fixed to the substrate 43 (or a back plate, not illustrated) as illustrated in FIG. 16B. When the whole outer peripheral portion of the circular vibration part 51 in the vibration electrode film 45 functions as the fixed part 52, the air does not flow in from the gap between the circular vibration part 51 and the substrate 43. Hence, previously forming a hole in the circular vibration part 51 is a precondition of the present invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. An acoustic sensor comprising:
   a semiconductor substrate comprising an opening;
   a back plate disposed facing the opening of the semiconductor substrate, that functions as a fixed electrode, and comprising sound holes that allow passage of air;
   a vibration electrode film disposed facing the back plate through a void; and
   a casing housing the substrate, the back plate, and the vibration electrode film, and comprising a pressure hole that allows inflow of air,
   wherein the acoustic sensor converts transformation of the vibration electrode film into a change in capacitance between the vibration electrode film and the back plate to detect sound pressure,
   wherein a flow path is formed, which includes any of the sound holes of the back plate, a gap between the back plate and the vibration electrode film, a gap between the vibration electrode film and the semiconductor substrate, and the opening of the semiconductor substrate, and in which a fluid flowing into the casing from the pressure hole moves to a space opposite the pressure hole across the vibration electrode film in the casing,
   wherein, when the vibration electrode film is transformed to approach the semiconductor substrate or the back plate due to the fluid flowing into the casing from the pressure hole, a flow path cutoff part restricts at least a part of the flow path,
   wherein the flow path cutoff part comprises at least one of at least one projection or at least one wall and is disposed on one of the vibration electrode film and the back plate,
   wherein, when the vibration electrode film is transformed to approach the back plate, the flow path cutoff part blocks at least some of the sound holes in the back plate by abutting the other of the vibration electrode film and the back plate, wherein at least one stopper is disposed on the one of the vibration electrode film and the back plate on which the flow path cutoff part is also disposed and extends in the same direction as the flow path cutoff part, wherein, when the vibration electrode film and the back plate approach each other, the at least one stopper nears the other of the vibration electrode film and the back plate, and wherein the flow path cutoff part is equal in height or taller than the stopper.

2. The acoustic sensor according to claim 1,
wherein the flow path cutoff part comprises the at least one projection disposed on one of the vibration electrode film and the back plate, and
wherein, when the vibration electrode film is transformed to approach the back plate, at least some of the sound holes in the back plate are each blocked by one of the at least one projection by abutting the other of the vibration electrode film and the back plate.

3. The acoustic sensor according to claim 2, wherein, when the vibration electrode film is transformed to approach the back plate, each of the sound holes on the back plate are blocked by one of the at least one projection.

4. The acoustic sensor according to claim 2,
wherein the vibration electrode film comprises a plate-shaped vibration part on which pressure acts and a fixed part that fixes the vibration part to the semiconductor substrate or the back plate, and
wherein, when the vibration electrode film is transformed to approach the back plate, each of the sound holes disposed near an outer periphery of the plate-shaped vibration part are blocked by one of the at least one projection.

5. The acoustic sensor according to claim 2,
wherein the flow path cutoff part comprises the at least one projection, where each projection has a cylindrical shape that encircles one of the sound holes in a plan view, and
wherein, when the vibration electrode film is transformed to approach the back plate, each of the sound holes in the back plate are encircled by one of the at least one projection.

6. The acoustic sensor according to claim 2,
wherein the back plate comprises a fixed electrode film and the flow path cutoff part, and
wherein the fixed electrode film is only disposed on the back plate away from a tip of the flow path cutoff part.

7. The acoustic sensor according to claim 1,
wherein the vibration electrode film comprises a plate-shaped vibration part on which pressure acts and a fixed part that fixes the vibration part to the semiconductor substrate or the back plate,
wherein the flow path cutoff part comprises the at least one wall disposed on one of the vibration electrode film and the back plate,
wherein the flow path cutoff part surrounds at least one of part of the vibration part or part of the back plate that faces the vibration part, and
wherein, when the vibration electrode film is transformed to approach the back plate, the flow path cutoff part abuts the other of the vibration electrode film and the back plate to restrict at least some of the flow path by at least partially blocking at least one of the gap between the vibration electrode film and the back plate or an opening of any of the sound holes of the back plate.

8. The acoustic sensor according to claim 1,
wherein the vibration electrode film comprises a plate-shaped vibration part on which pressure acts and a fixed part that fixes the vibration part to the semiconductor substrate or the back plate,
wherein the flow path cutoff part comprises the at least one wall disposed on one of the vibration electrode film and the semiconductor substrate,
wherein the flow path cutoff part surrounds at least one of the opening in the semiconductor substrate or part of the vibration electrode film near the opening of the semiconductor substrate, and
wherein, when the vibration electrode film is transformed to approach the semiconductor substrate, the flow path cutoff part abuts the other of the vibration electrode film and the semiconductor substrate to restrict at least some of the flow path by at least partially blocking at least one of the gap between the vibration electrode film and the semiconductor substrate or the opening of the semiconductor substrate.

9. An acoustic sensor comprising:
a semiconductor substrate comprising an opening;
a back plate disposed facing the opening of the semiconductor substrate, and comprising sound holes that allow passage of air;
a vibration electrode film disposed facing the back plate through a void; and
a casing housing the substrate, the back plate, and the vibration electrode film, and comprising a pressure hole that allows inflow of air,
wherein the acoustic sensor converts transformation of the vibration electrode film into a change in capacitance between the vibration electrode film and the back plate to detect sound pressure,
wherein, when the vibration electrode film is transformed to approach the semiconductor substrate or the back plate, a flow path inhibition part inhibits a flow of a fluid that passes through the opening of the semiconductor substrate or an opening of any of the sound holes of the back plate,
wherein the flow path inhibition part comprises at least one of at least one projection or at least one wall and is disposed on one of the vibration electrode film and the back plate,
wherein, when the vibration electrode film is transformed to approach the back plate, the flow path inhibition part blocks at least some of the sound holes in the back plate by abutting the other of the vibration electrode film and the back plate,
wherein at least one stopper is disposed on the one of the vibration electrode film and the back plate on which the flow path inhibition part is also disposed and extends in the same direction as the flow path inhibition part,
wherein, when the vibration electrode film and the back plate approach each other, the at least one stopper nears the other of the vibration electrode film and the back plate, and
wherein the flow path cutoff part is equal in height or taller than the stopper.

10. A capacitive transducer configured to be housed in a casing having a pressure hole that allows inflow of air, comprising:
a semiconductor substrate comprising an opening;
a back plate disposed facing the opening of the semiconductor substrate, functioning as a fixed electrode, and comprising sound holes that allow passage of air; and
a vibration electrode film disposed facing the back plate through a void, wherein transformation of the vibration electrode film is converted into a change in capacitance between the vibration electrode film and the back plate, wherein, when the vibration electrode film is transformed to approach the semiconductor substrate or the back plate, a flow path cutoff part cuts off at least some of a flow path for a fluid that passes through at least one of a gap between the vibration electrode film and the semiconductor substrate, a gap between the vibration electrode and the back plate, the opening of the semiconductor substrate, or an opening of any of the sound holes of the back plate, wherein the flow path cutoff part comprises at least one of at least one projection or at least one wall and is disposed on one of the vibration electrode film and the back plate, wherein, when the vibration electrode film is transformed to approach the back plate, the flow path cutoff part blocks at least some of the sound holes in the back plate by abutting the other of the vibration electrode film and the back plate, wherein at least one stopper is disposed on the one of the vibration electrode film and the back plate on which the flow path cutoff part is also disposed and extends in the same direction as the flow path cutoff part, wherein, when the vibration electrode film and the back plate approach each other, the at least one stopper nears the other of the vibration electrode film and the back plate r, and wherein the flow path cutoff part is equal in height or taller than the stopper.

11. The capacitive transducer according to claim 10, wherein the flow path cutoff part comprises the at least one projection disposed on one of the vibration electrode film and the back plate, and wherein, when the vibration electrode film is transformed to approach the back plate, at least some of the sound holes in the back plate are each blocked by one of the at least one projection by abutting the other of the vibration electrode film and the back plate.

12. The capacitive transducer according to claim 11, wherein, when the vibration electrode film is transformed to approach the back plate, each of the sound holes on the back plate are blocked by one of the at least one projection.

13. The capacitive transducer according to claim 11, wherein the vibration electrode film comprises a plate-shaped vibration part on which pressure acts and a fixed part that fixes the vibration part to the semiconductor substrate or the back plate, and wherein, when the vibration electrode film is transformed to approach the back plate, each of the sound holes disposed near an outer periphery of the plate-shaped vibration part are blocked by one of the at least one projection.

14. The capacitive transducer according to claim 11, wherein the flow path cutoff part comprises the at least one projection, where each projection has a cylindrical shape that encircles one of the sound holes in a plan view, and wherein, when the vibration electrode film is transformed to approach the back plate, each of the sound holes in the back plate are encircled by one of the at least one projection.

15. The capacitive transducer according to claim 11, wherein the back plate further comprises a fixed electrode film and the flow path cutoff part, and wherein the fixed electrode film is only disposed on the back plate away from a tip of the flow path cutoff part.

16. The capacitive transducer according to claim 10, wherein the vibration electrode film comprises a plate-shaped vibration part on which pressure acts and a fixed part that fixes the vibration part to the semiconductor substrate or the back plate, wherein the flow path cutoff part comprises the at least one wall disposed on one of the vibration electrode film and the back plate, wherein the flow path cutoff part surrounds at least one of part of the vibration part or part of the back plate that faces the vibration part, and wherein, when the vibration electrode film is transformed to approach the back plate, the flow path cutoff part abuts the other of the vibration electrode film and the back plate to restrict at least some of the flow path by at least partially blocking at least one of the gap between the vibration electrode film and the back plate or an opening of any of the sound holes of the back plate.

17. The capacitive transducer according to claim 10, wherein the vibration electrode film comprises a plate-shaped vibration part on which pressure acts and a fixed part that fixes the vibration part to the semiconductor substrate or the back plate, wherein the flow path cutoff part comprises the at least one wall disposed on one of the vibration electrode film and the semiconductor substrate, wherein the flow path cutoff part surrounds at least one of the opening in the semiconductor substrate or part of the vibration electrode film near the opening of the semiconductor substrate, and wherein, when the vibration electrode film is transformed to approach the semiconductor substrate, the flow path cutoff part abuts the other of the vibration electrode film and the semiconductor substrate to restrict at least some of the flow path by at least partially blocking at least one of the gap between the vibration electrode film and the semiconductor substrate or the opening of the semiconductor substrate.

18. A capacitive transducer configured to be housed in a casing having a pressure hole that allows inflow of air, comprising:

a semiconductor substrate comprising an opening on a surface;

a back plate disposed facing the opening of the semiconductor substrate, and comprising sound holes that allow passage of air; and a vibration electrode film disposed facing the back plate through a void, wherein transformation of the vibration electrode film is converted into a change in capacitance between the vibration electrode film and the back plate, wherein, when the vibration electrode film is transformed to approach the semiconductor substrate or the back plate, a flow path inhibition part inhibits a flow of a fluid passing through at least one of the opening of the semiconductor substrate or an opening of any of the sound holes of the back plate, wherein the flow path inhibition part comprises at least one of at least one projection or at least one wall and is disposed on one of the vibration electrode film and the back plate, wherein, when the vibration electrode film is transformed to approach the back plate, the flow path inhibitor blocks at least some of the sound holes in the back plate by abutting the other of the vibration electrode film and the back plate, wherein at least one stopper is disposed on the one of the vibration electrode film and the back plate on which the flow path inhibition part is also disposed and extends in the same direction as the flow path inhibition part, and wherein, when the vibration electrode film and the back plate approach each other, the stopper nears the other of the vibration electrode film and the back plate, and wherein the flow path cutoff part is equal in height or taller than the stopper.

* * * * *